(12) United States Patent
Takeda et al.

(10) Patent No.: US 11,488,824 B2
(45) Date of Patent: Nov. 1, 2022

(54) METHOD FOR MANUFACTURING SEMICONDUCTOR DEVICE USING SILICON-CONTAINING RESIST UNDERLAYER FILM FORMING COMPOSITION FOR SOLVENT DEVELOPMENT

(71) Applicant: NISSAN CHEMICAL INDUSTRIES, LTD., Tokyo (JP)

(72) Inventors: Satoshi Takeda, Toyama (JP); Makoto Nakajima, Toyama (JP); Yuta Kanno, Toyama (JP); Hiroyuki Wakayama, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 14/374,695

(22) PCT Filed: Jan. 23, 2013

(86) PCT No.: PCT/JP2013/051307
§ 371 (c)(1),
(2) Date: Jul. 25, 2014

(87) PCT Pub. No.: WO2013/115032
PCT Pub. Date: Aug. 8, 2013

(65) Prior Publication Data
US 2014/0377957 A1    Dec. 25, 2014

(30) Foreign Application Priority Data
Feb. 1, 2012 (JP) .............. JP2012-020124

(51) Int. Cl.
| G03F 7/075 | (2006.01) |
| G03F 7/11 | (2006.01) |
| H01L 21/027 | (2006.01) |
| C09D 183/04 | (2006.01) |
| H01L 21/308 | (2006.01) |
| C08G 77/00 | (2006.01) |

(52) U.S. Cl.
CPC ........ H01L 21/0274 (2013.01); C09D 183/04 (2013.01); G03F 7/0752 (2013.01); G03F 7/11 (2013.01); H01L 21/3081 (2013.01); C08G 77/80 (2013.01)

(58) Field of Classification Search
CPC ...... G03F 7/075; G03F 7/0757; G03F 7/0752; G03F 7/11
See application file for complete search history.

(56) References Cited

U.S. PATENT DOCUMENTS

| 3,966,510 A * | 6/1976 | Aonuma ........... H01F 1/061 148/105 |
| 5,468,394 A * | 11/1995 | Bader ................. C02F 1/54 210/729 |
| 6,030,541 A * | 2/2000 | Adkisson ........... H01L 21/0276 216/40 |
| 6,365,051 B1 * | 4/2002 | Bader ................. B01D 61/147 210/640 |
| 8,703,395 B2 * | 4/2014 | Namai ................ G03F 7/40 430/314 |
| 2004/0127613 A1* | 7/2004 | Kashiwagi ........... C08K 5/5425 524/261 |
| 2011/0143149 A1* | 6/2011 | Shibayama .......... C09D 183/08 428/447 |
| 2011/0241175 A1 | 10/2011 | Koh et al. |

FOREIGN PATENT DOCUMENTS

| CN | 102246096 A | 11/2011 |
| CN | 102257435 A | 11/2011 |
| JP | A-10-209134 | 8/1998 |
| JP | A-11-258813 | 9/1999 |

(Continued)

OTHER PUBLICATIONS

International Search Report issued in International Application No. PCT/JP2013/051307 dated Mar. 26, 2013 (with translation).
Written Opinion of the International Searching Authority issued in International Application No. PCT/JP2013/051307 dated Mar. 26, 2013 (with translation).
Mar. 9, 2020 Office Action issued in Korean Patent Application No. 10-2019-7034618.

* cited by examiner

Primary Examiner — Daborah Chacko-Davis
(74) Attorney, Agent, or Firm — Oliff PLC

(57) ABSTRACT

A resist underlayer film for a resist pattern formation by developing a resist with organic solvent after exposure of resist. Method for manufacturing a semiconductor includes: applying onto a substrate a resist underlayer film forming composition including hydrolyzable silanes, hydrolysis products of hydrolyzable silanes, hydrolysis-condensation products of hydrolyzable silanes, or a combination thereof. Hydrolyzable silanes being silane of Formulas (1), (2) and (3). Silane of Formulas (1), (2) and (3) in total silanes in a ratio % by mole of 45-90:6-20:0-35; baking the applied resist underlayer film forming composition to form a resist underlayer film; applying a composition to form a resist film; exposing the resist film to light; developing the resist film after exposure, with organic solvent to obtain patterned resist film; and etching the resist underlayer film by using the patterned resist film and processing the substrate using the patterned resist underlayer film; wherein $$Si(R^1)_4 \qquad \text{Formula (1)}$$

$$R^2[Si(R^3)_3] \qquad \text{Formula (2)}$$

$$R^4[Si(R^5)_3]_b \qquad \text{Formula (3)}.$$

11 Claims, No Drawings

(56) References Cited

FOREIGN PATENT DOCUMENTS

| | | |
|---|---|---|
| JP | A-2002-40668 | 2/2002 |
| JP | 2005-023291 A | 1/2005 |
| JP | A-2012-194216 | 10/2012 |
| JP | A-2012-237975 | 12/2012 |
| WO | 2010/140551 A1 | 12/2010 |
| WO | 2011/033965 A1 | 3/2011 |
| WO | WO 2011/102470 A1 | 8/2011 |
| WO | 2011/105368 A1 | 9/2011 |
| WO | WO 2012/008538 A1 | 1/2012 |

METHOD FOR MANUFACTURING SEMICONDUCTOR DEVICE USING SILICON-CONTAINING RESIST UNDERLAYER FILM FORMING COMPOSITION FOR SOLVENT DEVELOPMENT

TECHNICAL FIELD

The present invention relates to a composition for forming an underlayer film between a substrate and a resist (for example, a photoresist and an electron beam resist) used for manufacturing a semiconductor device. More specifically, the present invention relates to an underlayer film forming composition of a resist for lithography for the purpose of forming an underlayer film used in an under layer of a photoresist in a lithography process of semiconductor device manufacture. The present invention also relates to a method for forming a resist pattern using the aforementioned underlayer film forming composition.

BACKGROUND ART

Conventionally, microfabrication has been carried out by lithography using a photoresist in the manufacture of semiconductor devices. The microfabrication is a machining process in which a thin film of a photoresist is formed on a semiconductor substrate such as a silicon wafer, the thin film is irradiated with active light such as ultraviolet light through a mask pattern in which a pattern of the semiconductor device is drawn, the photoresist is developed, and the substrate is etched using the obtained photoresist pattern as a protective film. Micro-unevenness in accordance with the pattern is thus formed on the surface of the substrate. In recent years, however, semiconductor devices have been further integrated, and the active light to be used has had a shorter wavelength from a KrF excimer laser (248 nm) to an ArF excimer laser (193 nm). This raises a serious issue in influence of the active light reflections from the semiconductor substrate. In order to solve this issue, a method for providing an anti-reflective coating (bottom anti-reflective coating) between the photoresist and the substrate has been widely studied.

As an underlayer film between a semiconductor substrate and a photoresist, a film known as a hard mask that contains metal elements such as silicon and titanium has been used (for example, refer to Patent Document 1). In this case, constituents of the resist and the hard mask are significantly different, and thus, rates of removing the resist and the hard mask by dry etching largely depend on types of gases used for the dry etching. By appropriately selecting the types of gases, the hard mask can be removed by the dry etching without significant decrease in the film thickness of the photoresist. As described above, a resist underlayer film has been disposed between the semiconductor substrate and the photoresist in order to that an antireflection effect and other various effects are achieved in the manufacture of the semiconductor device in recent years. Although compositions for resist underlayer films have already been studied, development of a new material for the resist underlayer film has been desired because a variety of characteristics are required for the resist underlayer film.

Compositions using a compound containing a silicon-silicon bond and methods for forming patterns have been known (for example, refer to Patent Document 2). Materials for resist underlayer films have been known, which contains a tetrafunctional silane and a trifunctional silane in a specific ratio and is obtained by dissolving the silanes in solvents such as propylene glycol monoethyl ether and propylene glycol monomethyl ether (for example, refer to Patent Document 3).

PRIOR ART DOCUMENTS

Patent Documents

Patent Document 1: Japanese Patent Application Publication No. 11-258813 (JP 11-258813 A)
Patent Document 2: Japanese Patent Application Publication No. 10-209134 (JP 10-209134 A)
Patent Document 3: Japanese Patent Application Publication No. 2002-040668 (JP 2002-040668 A)

SUMMARY OF THE INVENTION

Problem to be Solved by the Invention

An object of the present invention is to provide a method for manufacturing a semiconductor device, the method including a step of forming a resist underlayer film that can be used as a hard mask and an anti-reflective coating.

Another object of the present invention is to provide a method for manufacturing a semiconductor device, the method including a step of forming a resist underlayer film that is difficult to cause intermixing with a resist, has a higher dry etching rate than the resist, and can form an excellent resist pattern when a resist developed with an organic solvent is used.

Still another object of the present invention is to provide an underlayer film forming composition of a resist for lithography that can be used for manufacturing a semiconductor device. More specifically, the object of the present invention is to provide the underlayer film forming composition of the resist for lithography for forming the resist underlayer film that can be used for a hard mask. The object of the present invention is also to provide the underlayer film forming composition of the resist for lithography for forming the resist underlayer film that can be used for an anti-reflective coating. The object of the present invention is to provide the resist underlayer film for lithography that causes no intermixing with the resist and having a higher dry etching rate compared with the resist and to provide the underlayer film forming composition of the resist for forming the underlayer film.

The object of the present invention is to provide, as the resist underlayer film, an underlayer film of a solvent development type resist that can form excellent resist pattern when a resist developed by an organic solvent is used.

Means for Solving the Problem

The present invention includes, as a first aspect, a method for manufacturing a semiconductor device, the method comprising: applying onto a substrate a resist underlayer film forming composition that includes hydrolyzable silanes, hydrolysis products of the hydrolyzable silanes, hydrolysis-condensation products of the hydrolyzable silanes, or a combination of the hydrolyzable silanes, the hydrolysis products, and the hydrolysis-condensation products, the hydrolyzable silanes being a silane of Formula (1), a silane of Formula (2), and a silane of Formula (3), and including the silane of Formula (1), the silane of Formula (2), and the silane of Formula (3) in total silanes in a ratio in % by mole of 45 to 90:6 to 20:0 to 35, and baking the applied resist underlayer film forming composition to form a resist underlayer film (Step (A)); applying a composition for a resist onto the underlayer film to form a resist film (Step (B)); exposing the resist film to light (Step (C)); developing the resist film after the exposing, with an organic solvent to obtain a patterned resist film (Step (D)); and etching the resist underlayer film by using the patterned resist film and processing the substrate using the patterned resist underlayer film (Step E), $$Si(R^1)_4 \quad \text{Formula (1)}$$

$$R^2[Si(R^3)_3]_a \quad \text{Formula (2)}$$

$$R^4[Si(R^5)_3]_b \quad \text{Formula (3)}$$

(where $R^1$, $R^3$, and $R^5$ are each an alkoxy group, an acyloxy group, or a halogen atom; $R^2$ is an organic group that includes a benzene ring optionally having a substituent and that bonds to a silicon atom through a Si—C bond; $R^4$ is an organic group that includes a hydrocarbon optionally having a substituent and that bonds to a silicon atom through a Si—C bond; a is an integer of 1 to 3; and b is an integer of 1 to 3);

as a second aspect, the method for manufacturing a semiconductor device according to the first aspect, in which Step (A) is Step (A') of forming an organic underlayer film on the substrate, applying the resist underlayer film forming composition as described in the first aspect onto the organic underlayer film, and baking the applied resist underlayer film forming composition to form the resist underlayer film, and Step (E) is Step (E') of etching the resist underlayer film by using the patterned resist film, etching the organic underlayer film by using the patterned resist underlayer film, and processing the substrate by using the patterned organic underlayer film;

as a third aspect, the method for manufacturing a semiconductor device according to the first aspect or the second aspect, in which the resist underlayer film forming composition includes the silane of Formula (1), the silane of Formula (2), and the silane of Formula (3) in total silanes in a ratio in % by mole of 70 to 90:10 to 20:0 to 20;

as a fourth aspect, the method for manufacturing a semiconductor device according to the first aspect or the second aspect, in which the resist underlayer film forming composition includes the silane of Formula (1), the silane of Formula (2), and the silane of Formula (3) in total silanes in a ratio in % by mole of 45 to 90:6 to 20:4 to 35;

as a fifth aspect, the method for manufacturing a semiconductor device according to any one of the first aspect to the fourth aspect, in which $R^2$ in Formula (2) is a phenyl group optionally having a substituent, and a is an integer of 1;

as a sixth aspect, the method for manufacturing a semiconductor device according to any one of the first aspect to the fifth aspect, in which $R^4$ in Formula (3) is a methyl group optionally having a substituent, and a is an integer of 1;

as a seventh aspect, the method for manufacturing a semiconductor device according to any one of the first aspect to the fifth aspect, in which $R^4$ in Formula (3) is an alkylene isocyanurate group optionally having a substituent, and a is an integer of 1; and as an eighth aspect, the method for manufacturing a semiconductor device according to any one of the first aspect to the seventh aspect, in which the substituent is an alkoxy group, an organic group having a protected alcoholic hydroxy group, or an allyl group.

Effect of the Invention

In the present invention, the resist underlayer film forming composition is a composition including hydrolysis-condensation products made of the hydrolyzable silanes, that is, including a polyorganosiloxane structure. The resist underlayer film made from the composition can function as a hard mask and an anti-reflective coating in the manufacture of the semiconductor device. The resist film is unlikely to cause intermixing with the resist and has a high dry etching rate compared with the resist in dry etching using a specific etching gas.

Therefore, when a semiconductor device is manufactured according to the method of the present invention, a fine pattern of the resist film can be suitably formed. In particular, an excellent pattern can be formed in the resist film when the resist developed by an organic solvent is used.

MODES FOR CARRYING OUT THE INVENTION

In the present invention an underlayer film of a resist is formed on a substrate by a coating method, or the resist underlayer film is formed on an organic underlayer film formed on the substrate and then a resist film (for example, a photoresist, an electron beam resist, or an EUV resist) is formed on the resist underlayer film. Subsequently, a resist pattern is formed by exposure to light and development, and the pattern is transferred by carrying out dry etching of the resist underlayer film using the resist pattern. The substrate is then processed by using the pattern, or the substrate is processed by using the organic underlayer film to which the pattern is transferred by etching.

The thickness of the resist film tends to be thinner in order that pattern collapse is prevented when the fine pattern is formed. Due to the thinning of the resist, in the dry etching for transferring the pattern to a film existing as a lower layer of the resist, the pattern cannot be transferred if the etching rate of the film as the lower layer is lower than that of the film as the upper layer. In the present invention, the resist underlayer film of the present specification (containing an inorganic silicon-based compound) covers the substrate with or without an organic underlayer film formed therebetween, and the resist film (organic resist film) covers the resist underlayer film in this order. Depending on selection of a dry etching gas, a film made of organic components and a film made of inorganic components have significantly different dry etching rates. The film made of the organic components has a high dry etching rate when an oxygen-based gas is used, while the film made of the inorganic components has a high dry etching rate when a halogen-containing gas is used.

For example, a resist pattern is formed, the pattern is transferred to a resist underlayer film of the present specification by dry-etching the resist underlayer film existing as the lower layer of the resist using a halogen-containing gas, and subsequently the substrate is processed using the halogen-containing gas in accordance with the pattern transferred to the resist underlayer film. Alternatively, an organic underlayer film located at the lower layer of the pattern-transferred resist underlayer film is dry-etched using an oxygen-based gas with the resist underlayer film so that the pattern is transferred to the organic underlayer film, and the substrate is processed using a halogen-containing gas with the pattern-transferred organic underlayer film.

In the present invention, the aforementioned resist underlayer film functions as a hard mask. Hydrolyzable groups in the silane structure in the present invention such as alkoxy groups, acyloxy groups, and halogen atoms are hydrolyzed or partially hydrolyzed, and thereafter a polymer having a polysiloxane structure is formed by a condensation reaction of silanol groups. This polyorganosiloxane structure has a sufficient function for acting as a hard mask.

Hydrolyzable silane compounds used in the present invention form the polyorganosiloxane by the hydrolysis and the subsequent condensation reaction.

The resist underlayer film obtained from the resist underlayer film forming composition of the present invention exerts effects when an overcoat resist is a resist for solvent development. For example, when a positive type resist is used and subjected to solvent development, an unexposed part of the positive type resist can be removed with a solvent because the unexposed part is water-insoluble. When a negative type resist is used and subjected to solvent development, an unexposed part can be removed with a solvent because the part has non-crosslinked structure. An excellent resist shape is obtained by using a polysiloxane obtained from the silanes in the underlayer of the resist in the process of solvent removal.

The polyorganosiloxane structure (intermediate film) is effective as a hard mask for etching of the organic underlayer film existing under the polyorganosiloxane structure and for processing (etching) of the substrate. In other words, the polyorganosiloxane structure has sufficient dry etching resistance to an oxygen-based dry etching gas for the organic underlayer film or during substrate processing.

The present invention provides a method for manufacturing a semiconductor device, the method comprising: applying onto a substrate a resist underlayer film forming composition that includes hydrolyzable silanes, hydrolysis products thereof, hydrolysis-condensation products thereof, or a combination thereof, in which the hydrolyzable silanes are a silane of Formula (1), a silane of Formula (2), and a silane of Formula (3), and that includes the silane of Formula (1), the silane of Formula (2), and the silane of Formula (3) in total silanes in a ratio in % by mole of 45 to 90:6 to 20:0 to 35, and baking the applied resist underlayer film forming composition to form a resist underlayer film (Step (A)); applying a composition for a resist onto the underlayer film to form a resist film (Step (B)); exposing the resist film to light (Step (C)); developing the resist film after the exposing, with an organic solvent to obtain a resist pattern (Step (D)); and etching the resist underlayer film by using the resist pattern and processing the substrate using the patterned resist underlayer film (Step E).

Furthermore, the present invention provides a method for manufacturing a semiconductor device, the method comprising: forming an organic underlayer film on a substrate and applying onto the organic underlayer film a resist underlayer film forming composition that includes hydrolyzable silanes, hydrolysis products thereof, hydrolysis-condensation products thereof, or a combination thereof, in which the hydrolyzable silanes are a silane of Formula (1), a silane of Formula (2), and a silane of Formula (3), and that includes the silane of Formula (1), the silane of Formula (2), and the silane of Formula (3) in total silanes in a ratio in % by mole of 45 to 90:6 to 20:0 to 35, and baking the applied resist underlayer film forming composition to form a resist underlayer film (Step (A')); applying a composition for a resist onto the underlayer film to form a resist film (Step (B)); exposing the resist film to light (Step (C)); developing the resist film after the exposing, with an organic solvent to obtain a resist pattern (Step (D)); and etching the resist underlayer film by using the resist pattern, etching the organic underlayer film by using the patterned resist underlayer film, and processing the substrate using the patterned organic underlayer film (Step E').

The silanes may include the silane of Formula (1), the silane of Formula (2), and the silane of Formula (3) in total silanes in a ratio in % by mole of 70 to 90:10 to 20:0 to 20.

The silanes may also include the silane of Formula (1), the silane of Formula (2), and the silane of Formula (3) in total silanes in a ratio in % by mole of 45 to 90:6 to 20:4 to 35.

The hydrolyzable silanes, the hydrolysis products thereof, and the hydrolysis-condensation products thereof may also be used as a mixture of these compounds. The condensation products that are made by hydrolyzing the hydrolyzable silanes and condensing the obtained hydrolysis products may be used. Partial hydrolysis products in which hydrolysis is not fully completed when the hydrolysis-condensation products are obtained and the silane compounds may be mixed with the hydrolysis-condensation products, and the resultant mixture may also be used. The condensation product is a polymer having a polysiloxane structure.

The resist underlayer film forming composition of the present invention includes the above hydrolyzable organosilane, hydrolysis products thereof, hydrolysis-condensation products thereof, or a combination of these compounds and a solvent. Examples of optional components include an acid, water, an alcohol, a curing catalyst, an acid generator, other organic polymer, a light absorption compound, and a surfactant.

The solid content in the resist underlayer film forming composition of the present invention is, for example, 0.5% by mass to 50% by mass, 1% by mass to 30% by mass, or 1% by mass to 25% by mass. Here, the solid content is a content in which a solvent component is eliminated from the total components of the (resist underlayer film) film forming composition.

The ratio of the hydrolyzable organosilane, the hydrolysis product thereof, and the hydrolysis-condensation product thereof in the solid content is 20% by mass or more, for example, 50% by mass to 100% by mass, 60% by mass to 100% by mass, or 70% by mass to 100% by mass.

In the hydrolyzable silane of Formula (1), $R^1$ is an alkoxy group, an acyloxy group, or a halogen atom.

Examples of the alkoxy group include an alkoxy group containing liner, branched, or cyclic alkyl part having a carbon atom number of 1 to 20, and include a methoxy group, an ethoxy group, an n-propoxy group, an i-propoxy group, an n-butoxy group, an i-butoxy group, an s-butoxy group, a t-butoxy group, an n-pentoxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, an n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2-trimethyl-n-propoxy group, a 1-ethyl-1-methyl-n-propoxy group, and a 1-ethyl-2-methyl-n-propoxy group.

Examples of the acyloxy group as $R^1$ of the hydrolyzable silane of Formula (1) include a $C_{2-20}$ acyloxy group, and include a methylcarbonyloxy group, an ethylcarbonyloxy group, an n-propylcarbonyloxy group, an i-propylcarbonyloxy group, a cyclopropylcarbonyloxy group, an n-butylcarbonyloxy group, an i-butylcarbonyloxy group, an s-butylcarbonyloxy group, a t-butylcarbonyloxy group, a cyclobutylcarbonyloxy group, a 1-methyl-cyclopropylcarbonyloxy group, a 2-methyl-cyclopropylcarbonyloxy group, an n-pentylcarbonyloxy group, a 1-methyl-n-butylcarbonyloxy group, a 2-methyl-n-butylcarbonyloxy group, a 3-methyl-n-butylcarbonyloxy group, a 1,1-dimethyl-n-propylcarbonyloxy group, a 1,2-dimethyl-n-propylcarbonyloxy group, a 2,2-dimethyl-n-propylcarbonyloxy group, a 1-ethyl-n-propylcarbonyloxy group, a cyclopentylcarbonyloxy group, a 1-methyl-cyclobutylcarbonyloxy group, a 2-methyl-cyclobutylcarbonyloxy group, a 3-methyl-cyclobutylcarbonyloxy group, a 1,2-dimethyl-cyclopropylcarbonyloxy group, a 2,3-dimethyl-cyclopropylcarbonyloxy group, a 1-ethyl-cyclopropylcarbonyloxy group, a 2-ethyl-cyclopropylcarbonyloxy group, an n-hexylcarbonyloxy group, a 1-methyl-n-pentylcarbonyloxy group, a 2-methyl-n-pentylcarbonyloxy group, a 3-methyl-n-pentylcarbonyloxy group, a 4-methyl-n-pentylcarbonyloxy group, a 1,1-dimethyl-n-butylcarbonyloxy group, a 1,2-dimethyl-n-butylcarbonyloxy group, a 1,3-dimethyl-n-butylcarbonyloxy group, a 2,2-dimethyl-n-butylcarbonyloxy group, a 2,3-dimethyl-n-butylcarbonyloxy group, a 3,3-dimethyl-n-butylcarbonyloxy group, a 1-ethyl-n-butylcarbonyloxy group, a 2-ethyl-n-butylcarbonyloxy group, and 1,1,2-trimethyl-n-propylcarbonyloxy group.

Examples of the halogen atom as $R^1$ of the hydrolyzable silane of Formula (1) include fluorine, chlorine, bromine, and iodine.

The hydrolyzable group such as an alkoxy group, an acyloxy group, and a halogen atom as $R^1$ of the hydrolyzable silane of Formula (1) is preferably the alkoxy group such as a methoxy group and an ethoxy group, and particularly the ethoxy group may be used.

In the hydrolyzable silane of Formula (2), $R^2$ is an organic group including a benzene ring optionally having a substituent and is bonding to a silicon atom through a Si—C bond.

In Formula (2), a may be set to an integer of 1. Examples of the organic group including a benzene ring optionally having a substituent as $R^2$ include a phenyl group optionally having a substituent and a combination of a benzene ring optionally having a substituent and an alkylene group. Examples of this alkylene group include alkylene groups corresponding to the alkyl groups exemplified below.

In Formula (2), a bis-silane compound such as 1,4-bis(trimethoxysilyl)benzene in which a is 2 may also be used.

Examples of the substituent used as $R^2$ include an alkoxy group and an organic group having a protected alcohol.

Examples of this alkoxy group include the above alkoxy group. For example, a methoxy group, an ethoxy group, and an isopropoxy group may be used.

As the organic group having a protected alcohol, a group substituting an alkoxy group with an alkoxy group may be exemplified and examples of the organic group include an alkoxy-alkoxy group. Examples of the alkoxy group in the alkoxy-alkoxy group include the above exemplified alkoxy group.

Examples of the alkoxy-alkoxy group include a methoxymethoxy group, an ethoxyethoxy group, and an ethoxymethoxy group.

Examples of the hydrolyzable group such as an alkoxy group, an acyloxy group, and a halogen atom used as $R^3$ of Formula (2) include the above exemplified hydrolyzable groups.

The hydrolyzable group such as an alkoxy group, an acyloxy group, and a halogen atom as $R^3$ of the hydrolyzable silane of Formula (2) is preferably the alkoxy group such as a methoxy group and an ethoxy group, and particularly the methoxy group may be used.

The compound of Formula (2) may include the following compounds:

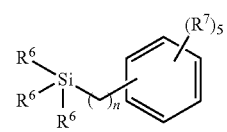

Formula (2-1)

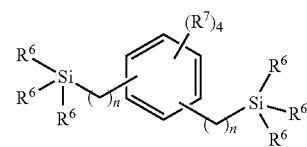

Formula (2-2)

Examples of $R^6$ in Formula (2-1) and Formula (2-2) include the above alkoxy group, acyloxy group, and halogen atom. Examples of $R^7$ include a hydrogen atom or a substituent and examples of the substituent include fluorine, chlorine, bromine, iodine, a hydroxy group, an alkoxy group, an acyloxy group, a vinyl ether group, an acryloyl group, a methacryloyl group, and a silane group. As the alkoxy group, the above exemplified alkoxy group may be used. n is an integer of 0 to 10, and, for example, n is 0, 1, and 2.

Specific examples of Formula (2-1) and Formula (2-2) include the following compounds:

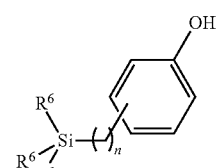

Formula (2-3)

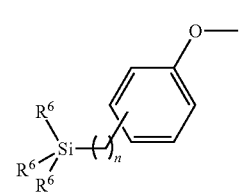

Formula (2-4)

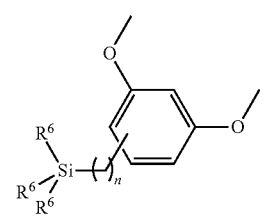

Formula (2-5)

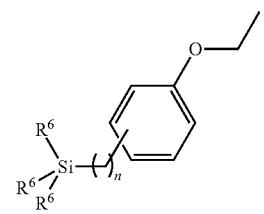

Formula (2-6)

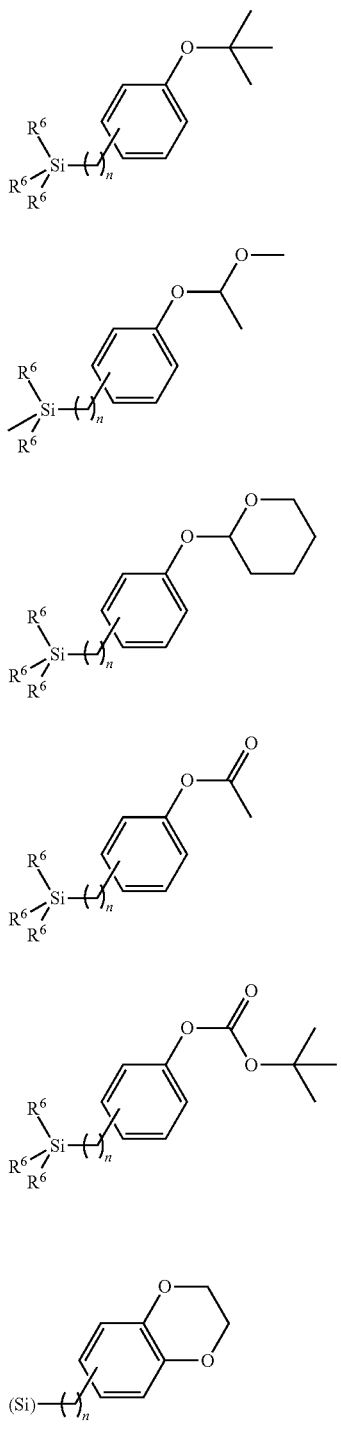

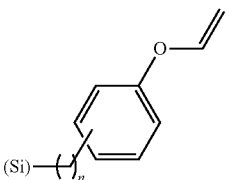
Formula (2-7)

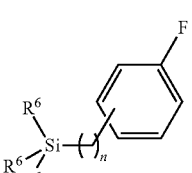
Formula (2-14)

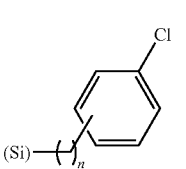
Formula (2-15)

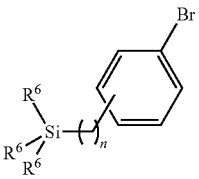
Formula (2-16)

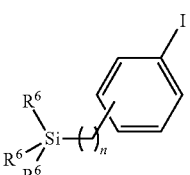
Formula (2-17)

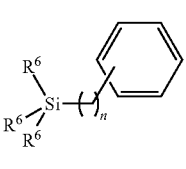
Formula (2-18)

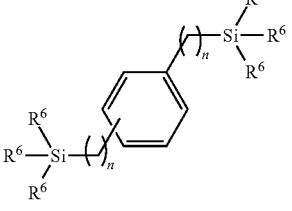
Formula (2-19)

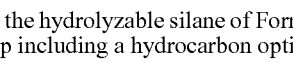

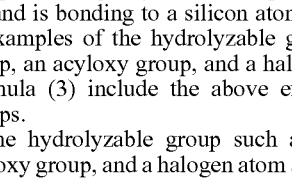
Formula (2-20)

In the hydrolyzable silane of Formula (3), $R^4$ is an organic group including a hydrocarbon optionally having a substituent and is bonding to a silicon atom through a Si—C bond.

Examples of the hydrolyzable group such as an alkoxy group, an acyloxy group, and a halogen atom used as $R^5$ of Formula (3) include the above exemplified hydrolyzable groups.

The hydrolyzable group such as an alkoxy group, an acyloxy group, and a halogen atom as $R^5$ of the hydrolyzable silane of Formula (3) is preferably the alkoxy group such as a methoxy group and an ethoxy group, and particularly the ethoxy group may be used.

In Formula (3), b may be an integer of 1 and $R^4$ may be a hydrocarbon group optionally having a substituent.

Examples of R⁴ include a methyl group optionally having a substituent. Examples of R⁴ also include an alkylene isocyanurate group optionally having a substituent. Examples of the alkylene group include alkylene groups corresponding to the alkyl groups (hydrocarbon groups) exemplified below.

Examples of the substituent used as R⁴ include the above alkoxy group, the above organic group having a protected alcohol, and an allyl group.

The hydrocarbon group is a $C_{1-10}$ alkyl group, and examples of the hydrocarbon group other than a methyl group include an ethyl group, an n-propyl group, an i-propyl group, a cyclopropyl group, an n-butyl group, an i-butyl group, an s-butyl group, a t-butyl group, a cyclobutyl group, a 1-methyl-cyclopropyl group, a 2-methyl-cyclopropyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group.

The hydrolysis-condensation product of the hydrolyzable silane may be exemplified below:

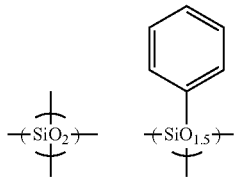

Formula (A-1)

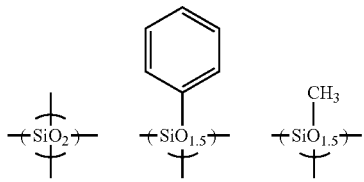

Formula (A-2)

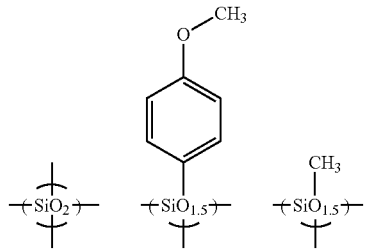

Formula (A-3)

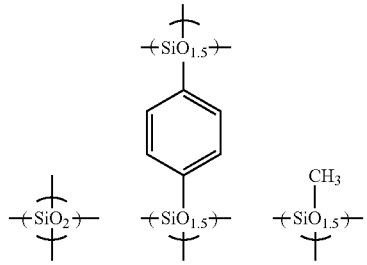

Formula (A-4)

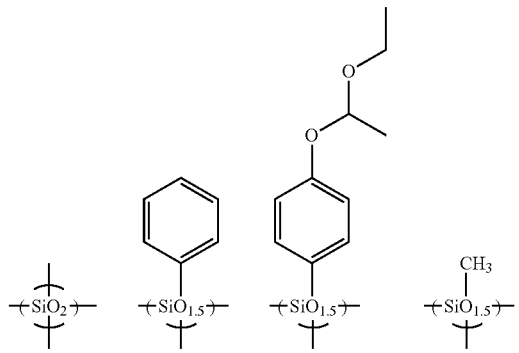

Formula (A-5)

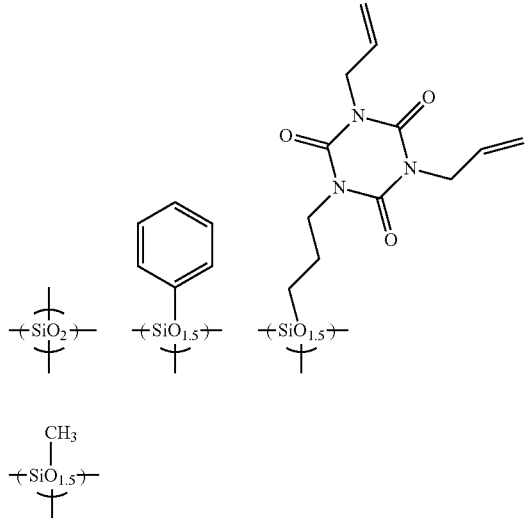

Formula (A-6)

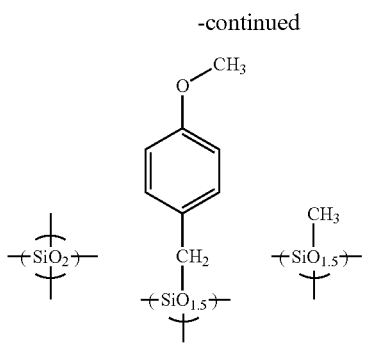

Formula (A-7)

The hydrolysis-condensation product (polyorganosiloxane) of the hydrolyzable silane having a weight average molecular weight of 1,000 to 1,000,000 or 1,000 to 100,000 may be obtained. These molecular weights are molecular weights obtained by GPC analysis in terms of polystyrene.

For example, GPC measurement may be carried out under the following measurement conditions. GPC equipment: (trade name HLC-8220GPC, manufactured by Tosoh Co., Ltd), GPC column: (trade name Shodex KF803L, KF802, and KF801, manufactured by Showa Denko KK), Column temperature: 40° C., Eluent (elution solvent): tetrahydrofuran, Flow volume (flow rate): 1.0 ml/min, and Standard sample: polystyrene (manufactured by Showa Denko KK).

For the hydrolysis of an alkoxysilyl group, an acyloxysilyl group, or a haloganated silyl group, 0.5 moles to 100 moles, preferably 1 mole to 10 moles of water per mole of the hydrolyzable group is used.

0.001 moles to 10 moles, preferably 0.001 moles to 1 mole of a hydrolysis catalyst per mol of the hydrolyzable group may be used.

A reaction temperature at the time of the hydrolysis and condensation is usually 20° C. to 80° C.

The hydrolysis may be complete hydrolysis or may be partial hydrolysis. In other words, a hydrolysis product or a monomer may remain in the hydrolysis-condensation product.

A catalyst may be used at the time of the hydrolysis and condensation.

Examples of the hydrolysis catalyst include a metal chelate compound, an organic acid, an inorganic acid, an organic base, and an inorganic base.

Examples of the metal chelate compound as the hydrolysis catalyst include titanium chelate compounds such as triethoxy-mono(acetylacetonato) titanium, tri-n-propoxy-mono(acetylacetonato) titanium, tri-i-propoxy-mono(acetylacetonato) titanium, tri-n-butoxy-mono(acetylacetonato) titanium, tri-sec-butoxy-mono(acetylacetonato) titanium, tri-t-butoxy-mono(acetylacetonato) titanium, diethoxy-bis(acetylacetonate) titanium, di-n-propoxy-bis(acetylacetonato) titanium, di-i-propoxy-bis(acetylacetonate) titanium, di-n-butoxy-bis(acetylacetonate) titanium, di-sec-butoxy-bis(acetylacetonate) titanium, di-t-butoxy-bis(acetylacetonate) titanium, monoethoxy-tris(acetylacetonato) titanium, mono-n-propoxy-tris(acetylacetonato) titanium, mono-i-propoxy-tris(acetylacetonato) titanium, mono-n-butoxy-tris(acetylacetonato) titanium, mono-sec-butoxy-tris(acetylacetonato) titanium, mono-t-butoxy-tris(acetylacetonato) titanium, tetrakis(acetylacetonato) titanium, triethoxy-mono(ethyl acetoacetate) titanium, tri-n-propoxy-mono(ethyl acetoacetate) titanium, tri-i-propoxy-mono(ethyl acetoacetate) titanium, tri-n-butoxy-mono(ethyl acetoacetate) titanium, tri-sec-butoxy-mono(ethyl acetoacetate) titanium, tri-t-butoxy-mono(ethyl acetoacetate) titanium, diethoxy-bis(ethyl acetoacetate) titanium, di-n-propoxy-bis(ethyl acetoacetate) titanium, di-i-propoxy-bis(ethyl acetoacetate) titanium, di-n-butoxy-bis(ethyl acetoacetate) titanium, di-sec-butoxy-bis(ethyl acetoacetate) titanium, di-t-butoxy-bis(ethyl acetoacetate) titanium, monoethoxy-tris(ethyl acetoacetate) titanium, mono-n-propoxy-tris(ethyl acetoacetate) titanium, mono-i-propoxy-tris(ethyl acetoacetate) titanium, mono-n-butoxy-tris(ethyl acetoacetate) titanium, mono-sec-butoxy-tris(ethyl acetoacetate) titanium, mono-t-butoxy-tris(ethyl acetoacetate) titanium, tetrakis(ethyl acetoacetate) titanium, mono(acetylacetonato)-tris(ethyl acetoacetate) titanium, bis(acetylacetonato)-bis(ethyl acetoacetate) titanium, and tris(acetylacetonato)-mono(ethyl acetoacetate) titanium; zirconium chelate compounds such as triethoxy-mono(acetylacetonato) zirconium, tri-n-propoxy-mono(acetylacetonato) zirconium, tri-i-propoxy-mono(acetylacetonato) zirconium, tri-n-butoxy-mono(acetylacetonato) zirconium, tri-sec-butoxy-mono(acetylacetonato) zirconium, tri-t-butoxy-mono(acetylacetonato) zirconium, diethoxy-bis(acetylacetonato) zirconium, di-n-propoxy-bis(acetylacetonato) zirconium, di-i-propoxy-bis(acetylacetonato) zirconium, di-n-butoxy-bis(acetylacetonato) zirconium, di-sec-butoxy-bis(acetylacetonato) zirconium, di-t-butoxy-bis(acetylacetonato) zirconium, monoethoxy-tris(acetylacetonato) zirconium, mono-n-propoxy-tris(acetylacetonato) zirconium, mono-i-propoxy-tris(acetylacetonato) zirconium, mono-n-butoxy-tris(acetylacetonato) zirconium, mono-sec-butoxy-tris(acetylacetonato) zirconium, mono-t-butoxy-tris(acetylacetonato) zirconium, tetrakis(acetylacetonato) zirconium, triethoxy-mono(ethyl acetoacetate) zirconium, tri-n-propoxy-mono(ethyl acetoacetate) zirconium, tri-i-propoxy-mono(ethyl acetoacetate) zirconium, tri-n-butoxy-mono(ethyl acetoacetate) zirconium, tri-sec-butoxy-mono(ethyl acetoacetate) zirconium, tri-t-butoxy-mono(ethyl acetoacetate) zirconium, diethoxy-bis(ethyl acetoacetate) zirconium, di-n-propoxy-bis(ethyl acetoacetate) zirconium, di-i-propoxy-bis(ethyl acetoacetate) zirconium, di-n-butoxy-bis(ethyl acetoacetate) zirconium, di-sec-butoxy-bis(ethyl acetoacetate) zirconium, di-t-butoxy-bis(ethyl acetoacetate) zirconium, monoethoxy-tris(ethyl acetoacetate) zirconium, mono-n-propoxy-tris(ethyl acetoacetate) zirconium, mono-i-propoxy-tris(ethyl acetoacetate) zirconium, mono-n-butoxy-tris(ethyl acetoacetate) zirconium, mono-sec-butoxy-tris(ethyl acetoacetate) zirconium, mono-t-butoxy-tris(ethyl acetoacetate) zirconium, tetrakis(ethyl acetoacetate) zirconium, mono(acetylacetonato)-tris(ethyl acetoacetate) zirconium, bis(acetylacetonato)-bis(ethyl acetoacetate) zirconium, and tris(acetylacetonato)-mono(ethyl acetoacetate) zirconium; and aluminum chelate compounds such as tris(acetylacetonato)aluminum and tris(ethyl acetoacetate)aluminum.

Examples of the organic acid as the hydrolysis catalyst include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, trimellitic acid, arachidonic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, a sulfonic acid, phthalic acid, fumaric acid, citric acid, and tartaric acid.

Examples of the inorganic acid as the hydrolysis catalyst include hydrochloric acid, nitric acid, sulfuric acid, hydrofluoric acid, and phosphoric acid.

Examples of the organic base as the hydrolysis catalyst include pyridine, pyrrole, piperazine, pyrrolidine, piperidine, picoline, trimethylamine, triethylamine, monoethanolamine, diethanolamine, dimethyl-monoethanolamine, monomethyl-diethanolamine, triethanolamine, diazabicyclooctane, diazabicyclononane, diazabicycloundecene, and tetramethylammonium hydroxide. Examples of the inorganic base include ammonia, sodium hydroxide, potassium hydroxide, barium hydroxide, and calcium hydroxide. Among these catalysts, the metal chelate compound, the organic acid, and the inorganic acid are preferable, and the catalysts may be used singly or in combination of two or more.

Examples of the organic solvent used for the hydrolysis include aliphatic hydrocarbon solvents such as n-pentane, i-pentane, n-hexane, i-hexane, n-heptane, i-heptane, 2,2,4-trimethylpentane, n-octane, i-octane, cyclohexane, and methylcyclohexane; aromatic hydrocarbon solvents such as benzene, toluene, xylene, ethylbenzene, trimethylbenzene, methylethylbenzene, n-propylbenzene, i-propylbenzene, diethylbenzene, i-butylbenzene, triethylbenzene, di-i-propylbenzene, n-amylnaphthalene, and trimethylbenzene; monoalcohol solvents such as methanol, ethanol, n-propanol, i-propanol, n-butanol, i-butanol, sec-butanol, t-butanol, n-pentanol, i-pentanol, 2-methyl-butanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenyl methyl carbinol, diacetone alcohol, and cresol; polyalcohol solvents such as ethylene glycol, propylene glycol, 1,3-butylene glycol, pentanediol-2,4,2-methylpentanediol-2,4, hexanediol-2,5, heptanediol-2,4,2-ethylhexanediol-1,3, diethylene glycol, dipropylene glycol, triethylene glycol, tripropylene glycol, and glycerin; ketone solvents such as acetone, methylethyl ketone, methyl-n-propyl ketone, methyl-n-butyl ketone, diethyl ketone, methyl-i-butyl ketone, methyl-n-pentyl ketone, ethyl-n-butyl ketone, methyl-n-hexyl ketone, di-i-butyl ketone, trimethylnonanone, cyclohexanone, methylcyclohexanone, 2,4-pentanedione, acetonylacetone, diacetone alcohol, acetophenone, and fenchone; ether solvents such as ethyl ether, i-propyl ether, n-butyl ether, n-hexyl ether, 2-ethylhexyl ether, ethylene oxide, 1,2-propylene oxide, dioxolane, 4-methyl-dioxolane, dioxane, dimethyl dioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyltetrahydrofuran; ester solvents such as diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methxoybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxy triglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents such as N-methylformamide, N,N-dimethylformamide, N,N-diethylformamide, acetamide, N-methylacetamide, N,N-dimethylacetamide, N-methylpropionamide, and N-methylpyrrolidone; and sulfur-containing solvents such as dimethyl sulfide, diethyl sulfide, thiophene, tetrahydrothiophene, dimethyl sulfoxide, sulfolane, and 1,3-propanesultone. These solvents may be used singly or in combination of two or more.

The following ketone solvents are particularly preferred from the viewpoint of storage stability of the solution: acetone, methylethyl ketone, methyl-n-propyl ketone, methyl-n-butyl ketone, diethyl ketone, methyl-i-butyl ketone, methyl-n-pentyl ketone, ethyl-n-butyl ketone, methyl-n-hexyl ketone, di-i-butyl ketone, trimethyl nonanone, cyclohexanone, methylcyclohexanone, 2,4-pentanedione, acetonylacetone, diacetone alcohol, acetophenone, and fenchone.

The resist underlayer film forming composition of the present invention may include a curing catalyst. The curing catalyst acts as a curing catalyst when a coating film containing a polyorganosiloxane made of the hydrolysis-condensation product is heated and cured.

As the curing catalyst, ammonium salts, phosphines, phosphonium salts, and sulfonium salts may be used.

Examples of the ammonium salt include a quaternary ammonium salt of Formula (B-1):

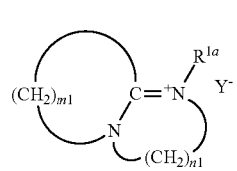

Formula (B-1)

(where m1 is an integer of 2 to 11; n1 is an integer of 2 or 3; $R^{1a}$ is an alkyl group or an aryl group; and $Y^-$ is an anion), a quaternary ammonium salt of Formula (B-2):

Formula (B-2)

(where $R^{2a}$, $R^{3a}$, $R^{4a}$, and $R^{5a}$ are each an alkyl group or an aryl group; N is a nitrogen atom; $Y^-$ is an anion; and $R^{2a}$, $R^{3a}$, $R^{4a}$, and $R^{5a}$ are each bonded to the nitrogen atom through a C—N bond), a quaternary ammonium salt of Formula (B-3):

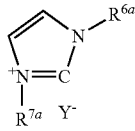

Formula (B-3)

(where $R^{6a}$ and $R^{7a}$ are each an alkyl group or an aryl group, and $Y^-$ is an anion), a quaternary ammonium salt of Formula (B-4):

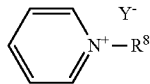

Formula (B-4)

(where $R^8$ is an alkyl group or an aryl group, and $Y^-$ is an anion), a quaternary ammonium salt of Formula (B-5):

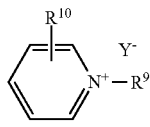

Formula (B-5)

(where $R^9$ and $R^{10}$ are each an alkyl group or an aryl group, and $Y^-$ is an anion), and a tertiary ammonium salt of Formula (B-6):

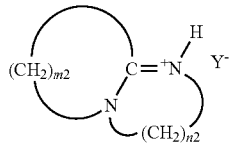

Formula (B-6)

(where m2 is an integer of 2 to 11; n2 is an integer of 2 or 3; H is a hydrogen atom; and $Y^-$ is an anion).

Examples of the phosphonium salts include a quaternary phosphonium salt of Formula (B-7):

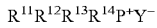

Formula (B-7)

(where $R^{11}$, $R^{12}$, $R^{13}$, and $R^{14}$ are each an alkyl group or an aryl group; P is a phosphorus atom; $Y^-$ is an anion; and $R^{11}$, $R^{12}$, $R^{13}$, and $R^{14}$ are each bonded to the phosphorus atom through a C—P bond).

Examples of the sulfonium salts include a tertiary sulfonium salt of Formula (B-8):

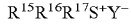

Formula (B-8)

(where $R^{15}$, $R^{16}$ and $R^{17}$ are each an alkyl group or an aryl group; S is a sulfur atom; $Y^-$ is an anion; and $R^{15}$, $R^{16}$, and $R^{17}$ are each bonded to the sulfur atom through a C—S bond).

The compound of Formula (B-1) is the quaternary ammonium salt derived from an amine. m1 is an integer of 2 to 11 and n1 is an integer of 2 or 3. $R^{1a}$ in the quaternary ammonium salt is a $C_{1-18}$, preferably $C_{2-10}$ alkyl group or aryl group. Examples of $R^{1a}$ include linear alkyl groups such as an ethyl group, a propyl group, and a butyl group, a benzyl group, a cyclohexyl group, a cyclohexylmethyl group, and a dicyclopentadienyl group. Examples of the anion ($Y^-$) include halogen ions such as a chlorine ion ($Cl^-$), a bromide ion ($Br^-$), and an iodide ion ($I^-$); and acid groups such as carboxylate (—$COO^-$), sulfonato (—$SO_3^-$), and alcoholate (—$O^-$).

The compound of Formula (B-2) is the quaternary ammonium salt of $R^{2a}R^{3a}R^{4a}R^{5a}N^+Y^-$. $R^{2a}$, $R^{3a}$, $R^{4a}$, and $R^{5a}$ in the quaternary ammonium salt are $C_{1-18}$ alkyl groups or aryl groups, or silane compounds including an alkyl group bonding to a silicon atom through a Si—C bond. Examples of the anion ($Y^-$) include halogen ions such as a chlorine ion ($Cl^-$), a bromide ion ($Br^-$), and an iodide ion ($I^-$); and acid groups such as carboxylate (—$COO^-$), sulfonato (—$SO_3$), and alcoholate (—$O^-$). The quaternary ammonium salt is commercially available and examples of the quaternary ammonium salt include tetramethylammonium acetate, tetrabutylammonium acetate, triethylbenzylammonium chloride, triethylbenzylammonium, bromide, trioctylmethylammonium chloride, tributylbenzylammonium chloride, and trimethylbenzylammonium chloride.

The compound of Formula (B-3) is the quaternary ammonium salt derived from 1-substituted imidazole. $R^{6a}$ and $R^{7a}$ are hydrogen atoms, or $C_{1-18}$ alkyl groups or aryl groups. Examples of $R^{6a}$ include a hydrogen atom, a methyl group, an ethyl group, a propyl group, a phenyl group, a benzyl group, and a silane compound including an alkyl group bonding to a silicon atom through a Si—C bond. Examples of $R^{7a}$ include a hydrogen atom, a benzyl group, an octyl group, an octadecyl group, and a silane compound including an alkyl group bonding to a silicon atom through a Si—C bond. Examples of the anion ($Y^-$) include halogen ions such as a chlorine ion ($Cl^-$), a bromide ion ($Br^-$), and an iodide ion ($I^-$); and acid groups such as carboxylate (—$COO^-$), sulfonato (—$SO_3^-$), and alcoholate (—$O^-$). The compound is commercially available, or may be manufactured by causing, for example, an imidazole-based compound such as 1-methylimidazole and 1-benzylimidazole to react with a halogenated alkyl or a halogenated aryl such as benzyl bromide and methyl bromide. In addition, an ammonium salt of N-(3-triethoxysilylpropyl)-4,5-dihydroimidazole may be exemplified. The compound of Formula (B-4) is the quaternary ammonium salt derived from pyridine. $R^8$ is a $C_{1-18}$, preferably $C_{4-18}$ alkyl group or aryl group. Examples of $R^8$ include a butyl group, an octyl group, a benzyl group, and a lauryl group. Examples of the anion ($Y^-$) include halogen ions such as a chlorine ion ($Cl^-$), a bromide ion ($Br^-$), and an iodide ion ($I^-$); and acid groups such as carboxylate (—$COO^-$), sulfonato (—$SO_3^-$), and alcoholate (—$O^-$). The compound is commercially available, or may be manufactured by causing, for example, pyridine to react with a halogenated alkyl or a halogenated aryl such as lauryl chloride, benzyl chloride, benzyl bromide, methyl bromide, and octyl bromide. Examples of the compound include N-laurylpyridinium chloride and N-benzylpyridinium bromide.

The compound of Formula (B-5) is the quaternary ammonium salt derived from a substituted pyridine as represented by picoline and the like. $R^9$ is a $C_{1-18}$, preferably $C_{4-18}$ alkyl group or aryl group. Examples of $R^9$ include a methyl group, an octyl group, a lauryl group, and a benzyl group. $R^{10}$ is a $C_{1-18}$ alkyl group or aryl group. For example, $R^{10}$ is a methyl group when the compound of Formula (B-5) is a quaternary ammonium derived from picoline. Examples of the anion ($Y^-$) include halogen ions such as a chlorine ion ($Cl^-$), a bromide ion (Br⁻), and an iodide ion (I⁻); and acid groups such as carboxylate (—COO⁻), sulfonato (—SO$_3^-$), and alcoholate (—O⁻). The compound is commercially available, or may be manufactured by causing, for example, a substituted pyridine such as picoline to react with a halogenated alkyl or a halogenated aryl such as methyl bromide, octyl bromide, lauryl chloride, benzyl chloride, and benzyl bromide. Examples of the compound include N-benzylpicolinium chloride, N-benzylpicolinium bromide, and N-laurylpicolinium chloride.

The compound of Formula (B-6) is the tertiary ammonium salt derived from an amine. m2 is an integer of 2 to 11 and n2 is an integer of 2 or 3. Examples of the anion (Y⁻) include halogen ions such as a chlorine ion (Cl⁻), a bromide ion (Br⁻), and an iodide ion (I⁻); and acid groups such as carboxylate (—COO⁻), sulfonato (—SO$_3^-$), and alcoholate (—O⁻). The compound may be manufactured by causing an amine to react with a weak acid such as a carboxylic acid and phenol. Example of the carboxylic acid include formic acid and acetic acid. When formic acid is used, the anion (Y⁻) is (HCOO⁻), and when acetic acid is used, the anion (Y⁻) is (CH$_3$COO⁻). When phenol is used, the anion (Y⁻) is (C$_6$H$_5$O⁻).

The compound of Formula (B-7) is the quaternary phosphonium salt having a structure of $R^{11}R^{12}R^{13}R^{14}P^+Y^-$. $R^{11}$, $R^{12}$, $R^{13}$, and $R^{14}$ in the quaternary phosphonium salt are $C_{1-18}$ alkyl groups or aryl groups, or silane compounds bonding to a silicon atom through a Si—C bond. Preferably three out of the four substituents of $R^{11}$ to $R^{14}$ are phenyl groups or substituted phenyl groups, and examples of the phenyl groups or substituted phenyl groups include a phenyl group and a tolyl group. Remaining one substituent is a $C_{1-18}$ alkyl group or aryl group, or a silane compound bonding to a silicon atom through a Si—C bond. Examples of the anion (Y⁻) include halogen ions such as a chlorine ion (Cl⁻), a bromide ion (Br⁻), and an iodide ion (I⁻); and acid groups such as carboxylate (—COO⁻), sulfonato (—SO$_3^-$), and alcoholate (—O⁻). The compound is commercially available and examples of the compound include halogenated tetraalkylphosphoniums such as a halogenated tetra-n-butylphosphonium and a halogenated tetra-n-propylphosphonium; halogenated trialkylbenzylphosphoniums such as a halogenated triethylbenzylphosphonium; halogenated triphenyl-mono-alkylphosphoniums such as a halogenated triphenylmethylphosphonium and a halogenated triphenylethylphosphonium; a halogenated triphenylbenzylphosphonium, a halogenated tetraphenylphosphonium, a halogenated tritolyl-mono-arylphosphonium, and a halogenated tritolyl-mono-alkylphosphonium (the halogen atom is a chlorine atom or a bromine atom). Particularly preferable examples include halogenated triphenyl-mono-alkylphosphoniums such as a halogenated triphenylmethylphosphonium and a halogenated triphenylethylphosphonium; halogenated triphenyl-mono-arylphosphoniums such as a halogenated triphenylbenzylphosphonium; halogenated tritolyl-mono-arylphosphoniums such as a halogenated tritolyl-mono-phenylphosphonium; and halogenated tritolyl-mono-alkylphosphoniums such as a halogenated tritolyl-mono-methylphosphonium (the halogen atom is a chlorine atom or a bromine atom).

Examples of the phosphines include primary phosphines such as methylphosphine, ethylphosphine, prophylphosphine, isopropylphosphine, isobutylphosphine, and phenylphosphine; secondary phosphines such as dimethylphosphine, diethylphosphine, diisopropylphosphine, diisoamylphosphine, and diphenylphosphine; and tertiary phosphines such as trimethylphosphine, triethylphosphine, triphenylphosphine, methyldiphenylphosphine, and dimethylphenylphosphine.

The compound of Formula (B-8) is the tertiary sulfonium salts having a structure of $R^{15}R^{16}R^{17}S^+Y^-$. $R^{15}$, $R^{16}$, and $R^{17}$ are $C_{1-18}$ alkyl groups or aryl groups, or silane compounds bonding to a silicon atom through a Si—C bond. Preferably three out of the four substituents of $R^{15}$ to $R^{17}$ are phenyl groups or substituted phenyl groups, and examples of the phenyl groups or substituted phenyl groups include a phenyl group and a tolyl group. Remaining one substituent is a $C_{1-18}$ alkyl group or aryl group. Examples of the anion (Y⁻) include halogen ions such as a chlorine ion (Cl⁻), a bromide ion (Br⁻), and an iodide ion (I⁻); and acid groups such as carboxylate (—COO⁻), sulfonato (—SO$_3^-$), and alcoholate (—O⁻). The compound is commercially available and examples of the compound include halogenated tetraalkylsulfoniums such as a halogenated tri-n-butylsulfonium and a halogenated tri-n-propylsulfonium; halogenated trialkylbenzylsulfoniums such as a halogenated diethylbenzylsulfonium; halogenated diphenyl-mono-alkyl sulfoniums such as a halogenated diphenylmethylsulfonium and a halogenated diphenylethylsulfonium; a halogenated triphenylsulfonium (the halogen atom is a chlorine atom or a bromine atom), tetraalkylphosphonium carboxylates such as tri-n-butylsulfonium carboxylate and tri-n-propylsulfonium carboxylate; trialkylbenzylsulfonium carboxylates such as diethylbenzylsulfonium carboxylate; diphenyl-mono-alkylsulfonium carboxylates such as diphenylmethylsulfonium carboxylate and diphenylethylsulfonium carboxylate; and triphenylsulfonium carboxylate. The halogenated triphenylsulfonium and the triphenylsulfonium carboxylate are particularly preferable.

A ratio of the curing catalyst is 0.01 parts by mass to 10 parts by mass, or 0.01 parts by mass to 5 parts by mass, or 0.01 parts by mass to 3 parts by mass per 100 parts by mass of the hydrolysis-condensation product (polyorganosiloxane).

In the present invention, an amine compound, a sulfide compound, and a phosphine compound corresponding to the ammonium salt, the sulfonium salts, and the phosphonium salt, respectively, may be selected as the curing catalyst.

The hydrolyzable organosilane may be hydrolyzed and condensed in a solvent using the catalyst, and alcohols being by-products, a used hydrolysis catalysis, and water may be simultaneously removed from the obtained hydrolysis-condensation product (a polymer) by distillation under reduced pressure or the like. The acid catalyst and the base catalyst used for the hydrolysis may be removed by neutralization and ion exchange. To the resist underlayer film forming composition for lithography of the present invention, an organic acid, water, an alcohol, or a combination thereof may be added in order to stabilize the resist underlayer film forming composition including the hydrolysis-condensation product.

Examples of the organic acid include oxalic acid, malonic acid, methylmalonic acid, succinic acid, maleic acid, malic acid, tartaric acid, phthalic acid, citric acid, glutaric acid, citric acid, lactic acid, and salicylic acid. Among them, oxalic acid and maleic acid are preferable. A ratio of the added organic acid is 0.1 parts by mass to 5.0 parts by mass per 100 parts by mass of the condensation product (polyorganosiloxane). As added water, pure water, ultrapure water, ion-exchanged water, or the like may be used. A ratio of the water may be 1 part by mass to 20 parts by mass per 100 parts of the resist underlayer film forming composition.

As the added alcohol, an alcohol that is readily evaporated by heating after application is preferable. Examples of the alcohol include methanol, ethanol, propanol, isopropanol, and butanol. A ratio of the added alcohol may be 1 part by mass to 20 parts by mass per 100 parts by mass of the resist underlayer film forming composition.

In the underlayer film forming composition of the present invention, bisphenol S may be used as an additive. For example, the followings are exemplified as the bisphenol S.

Formula (C-1)
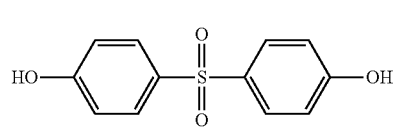

Formula (C-2)
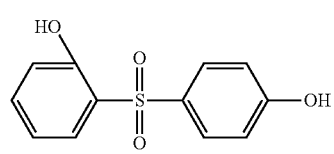

Formula (C-3)
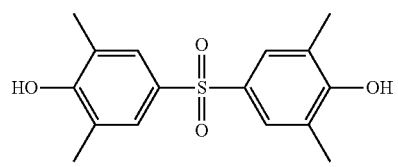

Formula (C-4)
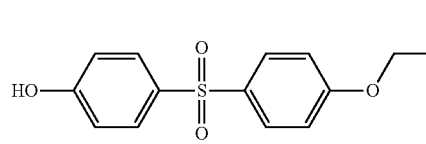

Formula (C-5)
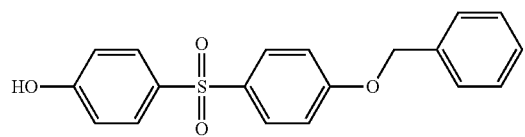

Formula (C-6)
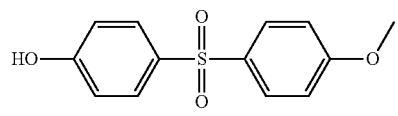

Formula (C-7)
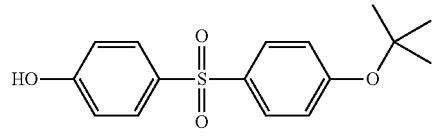

Formula (C-8)
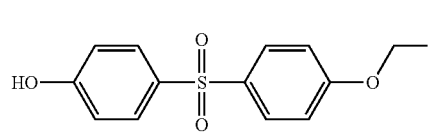

Formula (C-9)
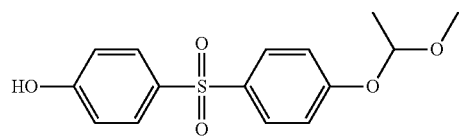

Formula (C-10)
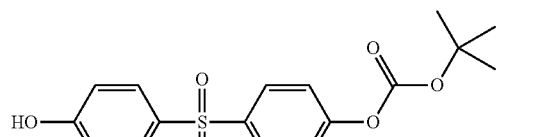

Formula (C-11)
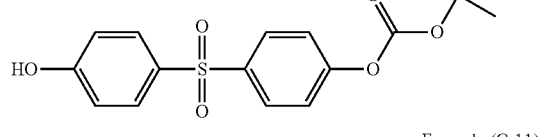

Formula (C-12)
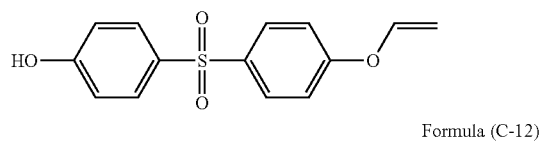

Formula (C-13)
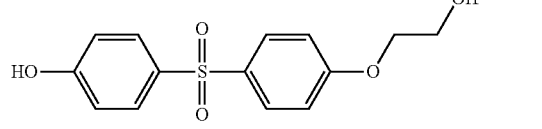

Formula (C-14)
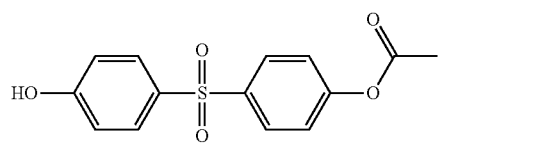

Formula (C-15)
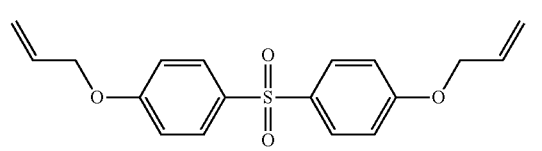

Formula (C-16)
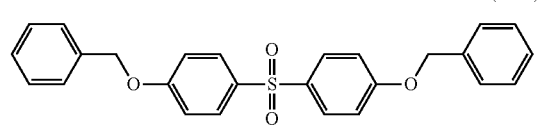

Formula (C-17)
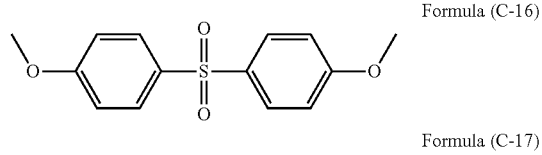

Formula (C-18)
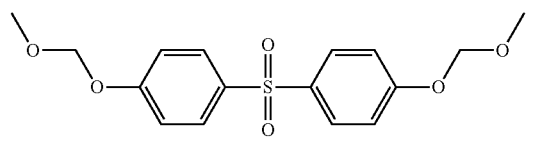

Formula (C-19)
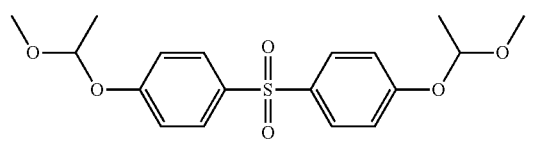

-continued

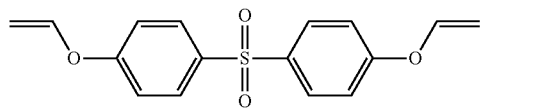
Formula (C-20)

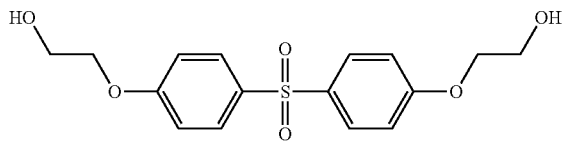
Formula (C-21)

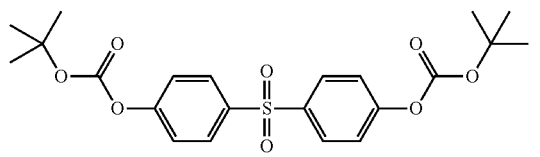
Formula (C-22)

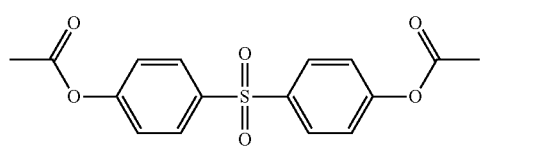
Formula (C-23)

The bisphenol S may be contained in a ratio of 0.01 parts by mass to 30 parts by mass per 100 parts by mass of the hydrolysis-condensation product (polyorganosiloxane).

Other than the above components, the underlayer film forming composition for lithography of the present invention may include an organic polymer compound, a photoacid generator, and a surfactant, if needed. Storage stability may be improved by containing the bisphenol S.

When the organic polymer compound is used, a dry etching rate (a decreased amount in film thickness per unit time), an attenuation coefficient, and a refractive index of the resist underlayer film formed from the underlayer film forming composition for lithography of the present invention may be adjusted.

The organic polymer compound is not limited to specific organic polymers, but the various organic polymers may be used. As the organic polymer compound, a condensation polymerization polymer, an addition polymerization polymer and the like may be used. Examples of the usable condensation polymerization polymer and addition polymerization polymer include a polyester, a polystyrene, a polyimide, an acrylic polymer, a methacrylic polymer, a polyvinyl ether, a phenol novolak, a naphthol novolak, a polyether, a polyamide, and a polycarbonate. An organic polymer having an aromatic ring structure functioning as a light absorbing site is preferably used, and examples of the aromatic ring structure include a benzene ring, a naphthalene ring, an anthracene ring, a triazine ring, a quinoline ring, and quinoxaline ring.

When the organic polymer compound includes a hydroxy group, the hydroxy group may react with the polyorganosiloxane to form crosslink.

As the organic polymer compound, a polymer compound having a weight average molecular weight of, for example, 1,000 to 1,000,000, or 3,000 to 300,000, or 5,000 to 200,000, or 10,000 to 100,000 may be used.

The organic polymer compound may be used singly or may be used in combination of two or more.

When the organic polymer compound is used, a ratio of the organic polymer compound is 1 part by mass to 200 parts by mass, or 5 parts by mass to 100 parts by mass, or 10 parts by mass to 50 parts by mass, or 20 parts by mass to 30 parts by mass per 100 parts by mass of the condensation product (polyorganosiloxane).

The resist underlayer film forming composition of the present invention may include an acid generator.

Examples of the acid generator include a thermal acid generator and a photoacid generator.

The photoacid generator generates an acid at time of exposure of the resist to light. Therefore, the photoacid generator may adjust an acidity of the underlayer film. Use of the photoacid generator is a method for adjusting the acidity of the underlayer film to acidity of the upper layer of the resist. By the adjustment of the acidity of the underlayer film, a pattern shape of the resist formed at the upper layer of the underlayer film may be adjusted.

Examples of the photoacid generator included in the resist underlayer film forming composition of the present invention include an onium salt compound, a sulfonimide compound, and a disulfonyldiazomethane compound.

Examples of the onium salt compound include iodonium salt compounds such as diphenyliodonium hexafluorophosphate, diphenyliodonium trifluoromethanesulfonate, diphenyliodonium nonafluoro-normal-butanesulfonate, diphenyliodonium perfluoro-normal-octanesulfonate, diphenyliodonium camphorsulfonate, bis(4-tert-butylphenyl)iodonium camphorsulfonate, and bis(4-tert-butylphenyl)iodonium trifluoromethanesulfonate; and sulfonium salt compounds such as triphenylsulfonium hexafluoroantimonate, triphenylsulfonium nonafluoro-normal-butanesulfonate, triphenylsulfonium camphorsulfonate, and triphenylsulfonium trifluoromethanesulfonate.

Examples of the sulfonimide compound include N-(trifluoromethanesulfonyloxy) succinimide, N-(nonafluoro-normal-butanesulfonyloxy) succinimide, N-(camphorsulfonyloxy) succinimide, and N-(trifluoromethanesulfonyloxy) naphthalimide.

Examples of the disulfonyldiazomethane compound include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyl diazomethane.

The photoacid generator may be used singly or may be used in combination of two or more.

When the photoacid generator is used, a ratio thereof is 0.01 parts by mass to 5 parts by mass, or 0.1 parts by mass to 3 parts by mass, or 0.5 parts by mass to 1 part by mass per 100 parts by mass of the condensation product (polyorganosiloxane).

A surfactant is effective for reducing generation of pinholes, striations, and the like when the resist underlayer film forming composition for lithography of the present invention is applied to the substrate.

Examples of the surfactant included in the resist underlayer film forming composition of the present invention include nonionic surfactants such as polyoxyethylene alkyl ethers including polyoxyethylene lauryl ether, polyoxyethylene stearyl ether, polyoxyethylene cetyl ether, and polyoxyethylene oleyl ether; polyoxyethylene alkylallyl ethers including polyoxyethylene octylphenol ether and polyoxyethylene nonylphenol ether; polyoxyethylene-polyoxypropylene block copolymers; sorbitan fatty acid esters including sorbitan monolaurate, sorbitan monopalmitate, sorbitan monostearate, sorbitan monooleate, sorbitan trioleate, and sorbitan tristearate; and polyoxyethylene sorbitan fatty acid esters including polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as Eftop EF301, EF303, and EF352 (trade name, manufactured by TOHKEM PRODUCTS CORPORATION), Megafac F171, F173, R-08, and R-30 (trade name, manufactured by Dainippon Ink and Chemicals Co., Ltd.), Fluorad FC430 and FC431 (manufactured by Sumitomo 3M Ltd.), Asahi guard AG710, Surflon S-382, SC101, SC102, SC103, SC104, SC105, and SC106 (trade name, manufactured by Asahi Glass Co., Ltd.); and Organosiloxane Polymer KP341 (manufactured by Shin-Etsu Chemical Co., Ltd.). These surfactants may be used singly or may be used in combination of two or more. When the surfactant is used, a ratio thereof is 0.0001 parts by mass to 5 parts by mass, or 0.001 parts by mass to 1 part by mass, or 0.01 parts by mass to 0.5 parts by mass per 100 parts by mass of the condensation product (polyorganosiloxane).

A rheology modifier and an adhesion assistance agent may be added to the resist underlayer film forming composition of the present invention. The rheology modifier is effective for improving fluidity of the underlayer film forming composition. The adhesion assistance agent is effective for improving adhesion of the underlayer film and the semiconductor substrate or the resist.

As a solvent used for the resist underlayer film forming composition of the present invention, any solvent may be used without limitation as long as the solvent can dissolve the solid content. Examples of the solvent include methylcellosolve acetate, ethylcellosolve acetate, propylene glycol, propylene glycol monomethyl ether, propylene glycol monoethyl ether, methyl isobutyl carbinol, propylene glycol monobutyl ether, propylene glycol monomethyl ether acetate, propylene glycol monoethyl ether acetate, propylene glycol monopropyl ether acetate, propylene glycol monobutyl ether acetate, toluene, xylene, methyl ethyl ketone, cyclopentanone, cyclohexanone, ethyl 2-hydroxypropionate, ethyl 2-hydroxy-2-methyl propionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol monoethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether propylene glycol monomethyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, ethyl hydroxyacetate, ethyl 2-hydroxy-2-methyl propionate, methyl 3-methoxy-2-methyl propionate, methyl 2-hydroxy-3-methyl butyrate, ethyl methoxyacetate, ethyl ethoxyacetate, methyl 3-methoxypropionate, ethyl 3-ethoxypropionate, ethyl 3-methoxypropionate, 3-methoxybutyl acetate, 3-methoxypropyl acetate, 3-methyl-3-methoxybutyl acetate, 3-methyl-3-methoxybutyl propionate, 3-methyl-3-methoxybutyl butyrate, methyl acetoacetate, toluene, xylene, methyl ethyl ketone, methyl propyl ketone, methyl butyl ketone, 2-heptanone, 3-heptanone, 4-heptanone, cyclohexanone, N,N-dimethylformamide, N-methylacetamide, N,N-dimethylacetamide, N-methylpyrrolidone, and γ-butyrolactone. These solvents may be used singly or in combination of two or more.

Hereinafter, use of the resist underlayer film forming composition of the present invention will be described.

The resist underlayer film forming composition of the present invention is applied onto a substrate (for example, a silicon wafer substrate, a silicon/silicon dioxide coated substrate, a silicon nitride substrate, a glass substrate, an ITO substrate, a polyimide substrate, and a low dielectric constant material (low-k material) coated substrate) used in the manufacture of semiconductor devices by an appropriate coating method using a spinner, a coater, or the like and thereafter, the applied resist underlayer film forming composition is baked to form a resist underlayer film. An organic underlayer film is formed on the substrate before the resist underlayer film used in the present invention is applied, and the resist underlayer film is formed on the organic underlayer film.

The baking condition is appropriately selected from a baking temperature of 80° C. to 250° C. and a baking time of 0.3 minutes to 60 minutes. Preferably the condition is a baking temperature of 150° C. to 250° C. and a baking time of 0.5 minutes to 2 minutes. The film thickness of the formed underlayer film is, for example, 10 nm to 1,000 nm, or 20 nm to 500 nm, or 50 nm to 300 nm, or 100 nm to 200 nm.

Subsequently, for example, a photoresist layer is formed on the resist underlayer film. The photoresist layer may be formed by a known method, that is, by applying a photoresist composition solution onto the underlayer film and baking. The thickness of the photoresist is, for example, 50 nm to 10,000 nm, or 100 nm to 2,000 nm, or 200 nm to 1,000 nm.

The photoresist formed on the resist underlayer film of the present invention is not limited to a specific photoresist as long as the photoresist is sensitive to the light used for exposure. Both a negative type photoresist and a positive type photoresist may be used. A photoresist that can be developed by an organic solvent after exposure may be used.

Examples of the photoresist include AR2772JN (trade name, manufactured by JSR Corporation) and FAiRS-9521NT05 (trade name, manufactured by FUJIFILM Corporation).

Next, exposure to light is carried out through a given mask. KrF excimer laser (a wavelength of 248 nm), ArF excimer laser (a wavelength of 193 nm), F2 excimer laser (a wavelength of 157 nm), and the like may be used for the exposure. After the exposure, post exposure bake may be carried out, if needed. The post exposure bake is carried out under an appropriately selected condition of a heating temperature of 70° C. to 150° C. and a heating time of 0.3 minutes to 10 minutes.

In the present invention, a resist for electron beam lithography may be used as a resist instead of the photoresist. Both a negative type electron beam resist and a positive type electron beam resist may be used as the electron beam resist. A resist may be used as long as the resist can be developed by an organic solvent after exposure.

When the electron beam resist is used, a resist pattern can be formed in a similar manner to the case where an electron beam is used as an irradiation source for the resist.

Subsequently, development is carried out with a developer (an organic solvent). This allows an unexposed part of the photoresist to be removed to form a pattern of the photoresist when, for example, a positive type photoresist is used.

Examples of the developer include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxy-butyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxy-pentyl acetate, 4-methyl-4-methoxy-pentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl 3-methoxypropionate, ethyl 3-methoxypropionate, ethyl 3-ethoxypropionate, propyl 3-methoxypropionate, and 2-heptanone. A surfactant and the like may be added to the developer. The development condition is appropriately selected from a temperature of 5° C. to 50° C. and a time of 10 seconds to 600 seconds.

The resist underlayer film (intermediate layer) of the present invention is removed by using thus formed pattern of the photoresist (upper layer) as a protective film. Subsequently, the organic underlayer film (lower layer) is removed by using a film consisting of the patterned photoresist and the resist underlayer film (intermediate layer) of the present invention as a protective film. Finally, the semiconductor substrate is processed by using the patterned resist underlayer film (intermediate layer) of the present invention and the organic underlayer film (lower layer) as protective films.

First, a part of the resist underlayer film (intermediate layer) of the present invention, which is the part where the photoresist is removed, is removed by dry etching so that the semiconductor substrate is exposed. Examples of usable gases for dry etching of the resist underlayer film of the present invention include tetrafluoromethane ($CF_4$), perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride, chlorine trifluoride, chlorine, trichloroborane, and dichloroborane. The resist underlayer film is preferably dry-etched by using the halogen-based gas. The photoresist made of organic substances is basically difficult to be removed by the dry etching using the halogen-based gas. On the contrary, the resist underlayer film of the present invention that contains many silicon atoms is rapidly removed with the halogen-based gas. Therefore, reduction in the film thickness of the photoresist associated with the dry etching of the resist underlayer film may be reduced. As a result, the photoresist may be used as a thin film. Dry etching of the resist underlayer film is preferably carried out by a fluorine-based gas. Examples of the fluorine-based gas include tetrafluoromethane ($CF_4$), perfluorocyclobutane ($C_4F_8$), perfluoropropane ($C_3F_8$), trifluoromethane, and difluoromethane ($CH_2F_2$).

Thereafter, the organic underlayer film is removed by using a film made of the patterned photoresist and resist underlayer film of the present invention as a protective film. The organic underlayer film (lower layer) is preferably dry-etched by using an oxygen-based gas. This is because the resist underlayer film of the present invention that contains many silicon atoms is difficult to be removed by dry etching with the oxygen-based gas.

Finally, the semiconductor substrate is processed. The semiconductor substrate is preferably processed by dry etching using a fluorine-based gas.

Examples of the fluorine-based gas include tetrafluoromethane ($CF_4$), perfluorocyclobutane ($C_4F_8$), perfluoropropane ($C_3F_8$), trifluoromethane, and difluoromethane ($CH_2F_2$).

At an upper layer of the resist underlayer film of the present invention, an organic-based anti-reflective coating may be formed before forming the photoresist. The anti-reflective coating composition to be used is not limited to a specific composition and any anti-reflective coating composition may be selected from anti-reflective coating compositions conventionally used in a lithography process to be used. The anti-reflective coating may be formed by a conventionally used method such as application with a spinner or a coater and baking.

In the present invention, after the organic underlayer film is formed on the substrate, the resist underlayer film of the present invention may be formed on the organic underlayer film and the resist underlayer film may be covered with the photoresist. This allows a photoresist pattern to have a narrow width. Even when the resist underlayer film is covered with a thin photoresist for the purpose of preventing the pattern collapse, the substrate may be processed by appropriately selecting the etching gas. For example, the resist underlayer film of the present invention may be processed by using the fluorine-based gas as the etching gas so that the resist underlayer film has a sufficiently high etching rate than the photoresist. The organic underlayer film may also be processed by using the oxygen-based gas as the etching gas so that the oxygen-based gas has a sufficiently high etching rate than the resist underlayer film of the present invention. Furthermore, the substrate may be processed by using the fluorine-based gas as the etching gas so that the substrate has a sufficiently high etching rate than the organic underlayer film.

The substrate onto which the resist underlayer film forming composition of the present invention is applied may be a substrate having an organic or inorganic anti-reflective coating formed by a CVD method or the like on its surface. The underlayer film of the present invention may be formed on the anti-reflective coating.

The resist underlayer film formed from the resist underlayer film forming composition of the present invention may absorb light depending on a wavelength of the light used in a lithography process. In this case, the resist underlayer film functions as an anti-reflective coating having an effect to prevent the reflected light from the substrate. The underlayer film of the present invention may further be used as a layer for preventing interaction between the substrate and the photoresist, a layer having a function to prevent an adverse effect of the materials used for the photoresist or substances generated at the time of exposure of the photoresist to light on a substrate, a layer having a function to prevent diffusion of the substances generated from the substrate at the time of heating and baking to the photoresist at the upper layer, a barrier layer for reducing a poisoning effect of the photoresist layer caused by a semiconductor substrate dielectric layer, and the like.

The resist underlayer film formed from the resist underlayer film forming composition is applied to a substrate in which via holes used in a dual damascene process are formed. The resist underlayer film may be used as an embedding material that fills the holes without clearance. The resist underlayer film may also be used as a planarizing material that is used to planarize the surface of the semiconductor substrate having unevenness.

EXAMPLES

Hereinafter, the present invention will be specifically described with reference to examples. The present invention, however, is not limited by the examples.

Synthesis Example 1

Into a 200 ml flask, 14.58 g of tetraethoxysilane (70% by mole in total silane compounds), 3.57 g of methyltriethoxysilane (20% by mole in total silane compounds), 1.98 g of phenyltrimethoxysilane (10% by mole in total silane compounds), and 31 g of acetone were added, and then 6.67 g of 0.01 mol/l hydrochloric acid was added dropwise to the mixed solution while the solution was stirred with a magnetic stirrer. After the addition, the flask was moved into an oil bath adjusted at 85° C., and the reaction solution was reacted for 240 minutes under a heated reflux condition. Thereafter, the reaction solution was cooled to room temperature, and 40 g of propylene glycol monomethyl ether acetate was added. Methanol, ethanol, water, and hydrochloric acid being by-products were removed by evaporation under reduced pressure, and the resultant solution was concentrated to obtain the hydrolysis-condensation product (polymer) propylene glycol monomethyl ether acetate solution. To the solution, propylene glycol monoethyl ether was added to adjust a solvent ratio of propylene glycol monomethyl ether acetate/propylene glycol monoethyl ether to 20/80 and a concentration of the solution to 15% by mass in terms of solid residue at 140° C. A weight average molecular weight in terms of polystyrene of the obtained polymer A (corresponding to a polymer containing the unit structure of Formula (A-2)) measured by GPC was Mw 1,500.

Synthesis Example 2

Into a 200 ml flask, 9.72 g of tetraethoxysilane (70% by mole in total silane compounds), 1.78 g of methyltriethoxysilane (15% by mole in total silane compounds), 1.98 g of phenyltrimethoxysilane (15% by mole in total silane compounds), and 31 g of acetone were added, and then 4.44 g of 0.01 mol/l hydrochloric acid was added dropwise to the mixed solution while the solution was stirred with a magnetic stirrer. After the addition, the flask was moved into an oil bath adjusted at 85° C., and the reaction solution was reacted for 240 minutes under the heated reflux condition. Thereafter, reaction solution was cooled to room temperature, and 40 g of propylene glycol monomethyl ether acetate was added. Methanol, ethanol, water, and hydrochloric acid being by-products were removed by evaporation under reduced pressure, and the resultant solution was concentrated to obtain the hydrolysis-condensation product (polymer) propylene glycol monomethyl ether acetate solution. To the solution, propylene glycol monoethyl ether was added to adjust a solvent ratio of propylene glycol monomethyl ether acetate/propylene glycol monoethyl ether to 20/80 and a concentration of the solution to 15% by mass in terms of solid residue at 140° C. A weight average molecular weight in terms of polystyrene of the obtained polymer B (corresponding to a polymer containing the unit structure of Formula (A-2)) measured by GPC was Mw 1,500.

Synthesis Example 3

Into a 200 ml flask, 14.58 g of tetraethoxysilane (70% by mole in total silane compounds), 3.57 g of methyltriethoxysilane (20% by mole in total silane compounds), 2.42 g of trimethoxy(4-methoxybenzyl)silane (10% by mole in total silane compounds), and 31 g of acetone were added, and then 6.67 g of 0.01 mol/l hydrochloric acid was added dropwise to the mixed solution while the solution was stirred with a magnetic stirrer. After the addition, the flask was moved into an oil bath adjusted at 85° C., and the reaction solution was reacted for 240 minutes under the heated reflux condition. Thereafter, the reaction solution was cooled to room temperature, and 42 g of propylene glycol monomethyl ether acetate was added. Methanol, ethanol, water, and hydrochloric acid being by-products were removed by evaporation under reduced pressure, and the resultant solution was concentrated to obtain the hydrolysis-condensation product (polymer) propylene glycol monomethyl ether acetate solution. To the solution, propylene glycol monoethyl ether was added to adjust a solvent ratio of propylene glycol monomethyl ether acetate/propylene glycol monoethyl ether to 20/80 and a concentration of the solution to 15% by mass in terms of solid residue at 140° C. A weight average molecular weight in terms of polystyrene of the obtained polymer C (corresponding to a polymer containing the unit structure of Formula (A-7)) measured by GPC was Mw 1,500.

Synthesis Example 4

Into a 200 ml flask, 14.58 g of tetraethoxysilane (70% by mole in total silane compounds), 3.57 g of methyltriethoxysilane (20% by mole in total silane compounds), 3.18 g of 1,4-bis(trimethoxysilyl)benzene (10% by mole in total silane compounds), and 32 g of acetone were added, and then 6.67 g of 0.01 mol/l hydrochloric acid was added dropwise to the mixed solution while the solution was stirred with a magnetic stirrer. After the addition, the flask was moved into an oil bath adjusted at 85° C., and the reaction solution was reacted for 240 minutes under the heated reflux condition. Thereafter, the reaction solution was cooled to room temperature, and 42 g of propylene glycol monomethyl ether acetate was added. Methanol, ethanol, water, and hydrochloric acid being by-products were removed by evaporation under reduced pressure, and the resultant solution was concentrated to obtain the hydrolysis-condensation product (polymer) propylene glycol monomethyl ether acetate solution. To the solution, propylene glycol monoethyl ether was added to adjust a solvent ratio of propylene glycol monomethyl ether acetate/propylene glycol monoethyl ether to 20/80 and a concentration of the solution to 15% by mass in terms of solid residue at 140° C. A weight average molecular weight in terms of polystyrene of the obtained polymer D (corresponding to a polymer containing the unit structure of Formula (A-4)) measured by GPC was Mw 3,000.

Synthesis Example 5

Into a 200 ml flask, 16.67 g of tetraethoxysilane (80% by mole in total silane compounds), 1.78 g of methyltriethoxysilane (10% by mole in total silane compounds), 1.98 g of phenyltrimethoxysilane (10% by mole in total silane compounds), and 60 g of acetone were added, and then 6.85 g of 0.01 mol/l hydrochloric acid was added dropwise to the mixed solution while the solution was stirred with a magnetic stirrer. After the addition, the flask was moved into an oil bath adjusted at 85° C., and the reaction solution was reacted for 240 minutes under the heated reflux condition. Thereafter, the reaction solution was cooled to room temperature, and 40 g of propylene glycol monomethyl ether acetate was added. Methanol, ethanol, water, and hydrochloric acid being by-products were removed by evaporation under reduced pressure, and the resultant solution was concentrated to obtain the hydrolysis-condensation product (polymer) propylene glycol monomethyl ether acetate solution. To the solution, propylene glycol monoethyl ether was added to adjust a solvent ratio of propylene glycol monomethyl ether acetate/propylene glycol monoethyl ether to 20/80 and a concentration of the solution to 15% by mass in terms of solid residue at 140° C. A weight average molecular weight in terms of polystyrene of the obtained polymer E (corresponding to a polymer containing the unit structure of Formula (A-2)) measured by GPC was Mw 1,500.

Synthesis Example 6

Into a 200 ml flask, 16.67 g of tetraethoxysilane (80% by mole in total silane compounds), 1.25 g of methyltriethoxysilane (7% by mole in total silane compounds), 1.98 g of phenyltrimethoxysilane (10% by mole in total silane compounds), 0.86 g of 4-(1-ethoxyethoxy)phenyltrimethoxysilane (3% by mole in total silane compounds), and 31 g of acetone were added, and then 6.90 g of 0.01 mol/l hydrochloric acid was added dropwise to the mixed solution while the solution was stirred with a magnetic stirrer. After the addition, the flask was moved into an oil bath adjusted at 85° C., and the reaction solution was reacted for 240 minutes under the heated reflux condition. Thereafter, the reaction solution was cooled to room temperature, and 42 g of propylene glycol monomethyl ether acetate was added. Methanol, ethanol, water, and hydrochloric acid being by-products were removed by evaporation under reduced pressure, and the resultant solution was concentrated to obtain the hydrolysis-condensation product (polymer) propylene glycol monomethyl ether acetate solution. To the solution, propylene glycol monoethyl ether was added to adjust a solvent ratio of propylene glycol monomethyl ether acetate/propylene glycol monoethyl ether to 20/80 and a concentration of the solution to 15% by mass in terms of solid residue at 140° C. A weight average molecular weight in terms of polystyrene of the obtained polymer F (corresponding to a polymer containing the unit structure of Formula (A-5)) measured by GPC was Mw 1,500.

Synthesis Example 7

Into a 200 ml flask, 16.67 g of tetraethoxysilane (80% by mole in total silane compounds), 0.89 g of methyltriethoxysilane (5% by mole in total silane compounds), 1.98 g of phenyltrimethoxysilane (10% by mole in total silane compounds), 2.07 g of 3-(triethoxysilyl)propyldiallylisocyanurate (5% by mole in total silane compounds), and 31 g of acetone were added, and then 6.94 g of 0.01 mol/l hydrochloric acid was added dropwise to the mixed solution while the solution was stirred with a magnetic stirrer. After the addition, the flask was moved into an oil bath adjusted at 85° C., and the reaction solution was reacted for 240 minutes under the heated reflux condition. Thereafter, the reaction solution was cooled to room temperature, and 44 g of propylene glycol monomethyl ether acetate was added. Methanol, ethanol, water, and hydrochloric acid being by-products were removed by evaporation under reduced pressure, and the resultant solution was concentrated to obtain the hydrolysis-condensation product (polymer) propylene glycol monomethyl ether acetate solution. To the solution, propylene glycol monoethyl ether was added to adjust a solvent ratio of propylene glycol monomethyl ether acetate/propylene glycol monoethyl ether to 20/80 and a concentration of the solution to 15% by mass in terms of solid residue at 140° C. A weight average molecular weight in terms of polystyrene of the obtained polymer G (corresponding to the polymer containing a unit structure of Formula (A-6)) measured by GPC was Mw 1,500.

Synthesis Example 8

Into a 200 ml flask, 18.75 g of tetraethoxysilane (90% by mole in total silane compounds), 1.98 g of phenyltrimethoxysilane (10% by mole in total silane compounds), and 31 g of acetone were added, and then 7.03 g of 0.01 mol/l hydrochloric acid was added dropwise to the mixed solution while the solution was stirred with a magnetic stirrer. After the addition, the flask was moved into an oil bath adjusted at 85° C., and the reaction solution was reacted for 240 minutes under the heated reflux condition. Thereafter, the reaction solution was cooled to room temperature, and 42 g of propylene glycol monomethyl ether acetate was added. Methanol, ethanol, water, and hydrochloric acid being by-products were removed by evaporation under reduced pressure, and the resultant solution was concentrated to obtain the hydrolysis-condensation product (polymer) propylene glycol monomethyl ether acetate solution. To the solution, propylene glycol monoethyl ether was added to adjust a solvent ratio of propylene glycol monomethyl ether acetate/propylene glycol monoethyl ether to 20/80 and a concentration of the solution to 15% by mass in terms of solid residue at 140° C. A weight average molecular weight in terms of polystyrene of the obtained polymer H (corresponding to a polymer containing the unit structure of Formula (A-1)) measured by GPC was Mw 2,000.

Comparative Synthesis Example 1

Into a 200 ml flask, 29.17 g of tetraethoxysilane (70% by mole in total silane compounds), 8.92 g of methyltriethoxysilane (25% by mole in total silane compounds), 1.98 g of phenyltrimethoxysilane (5% by mole in total silane compounds), and 60 g of acetone were added, and then 13.33 g of 0.01 mol/l hydrochloric acid was added dropwise to the mixed solution while the solution was stirred with a magnetic stirrer. After the addition, the flask was moved into an oil bath adjusted at 85° C., and the reaction solution was reacted for 240 minutes under the heated reflux condition. Thereafter, the reaction solution was cooled to room temperature, and 80 g of propylene glycol monomethyl ether acetate was added. Methanol, ethanol, water, and hydrochloric acid being by-products were removed by evaporation under reduced pressure, and the resultant solution was concentrated to obtain the hydrolysis-condensation product (polymer) propylene glycol monomethyl ether acetate solution. To the solution, propylene glycol monoethyl ether was added to adjust a solvent ratio of propylene glycol monomethyl ether acetate/propylene glycol monoethyl ether to 20/80 and a concentration of the solution to 15% by mass in terms of solid residue at 140° C. A weight average molecular weight in terms of polystyrene of the obtained polymer a (corresponding to a polymer containing the unit structure of Formula (A-2)) measured by GPC was Mw 1,500.

Comparative Example 2

Into a 200 ml flask, 8.33 g of tetraethoxysilane (40% by mole in total silane compounds), 8.92 g of methyltriethoxysilane (50% by mole in total silane compounds), 1.98 g of phenyltrimethoxysilane (10% by mole in total silane compounds), and 29 g of acetone were added, and then 6.13 g of 0.01 mol/l hydrochloric acid was added dropwise to the mixed solution while the solution was stirred with a magnetic stirrer. After the addition, the flask was moved into an oil bath adjusted at 85° C., and the reaction solution was reacted for 240 minutes under the heated reflux condition. Thereafter, the reaction solution was cooled to room temperature, and 40 g of propylene glycol monomethyl ether acetate was added. Methanol, ethanol, water, and hydrochloric acid being by-products were removed by evaporation under reduced pressure, and the resultant solution was concentrated to obtain the hydrolysis-condensation product (polymer) propylene glycol monomethyl ether acetate solution. To the solution, propylene glycol monoethyl ether was added to adjust a solvent ratio of propylene glycol monomethyl ether acetate/propylene glycol monoethyl ether to 20/80 and a concentration of the solution to 15% by mass in terms of solid residue at 140° C. A weight average molecular weight in terms of polystyrene of the obtained polymer b (corresponding to a polymer containing the unit structure of Formula (A-2)) measured by GPC was Mw 1,500.

(Preparation of Resist Underlayer Film Forming Composition)

Each of the silicon-containing polymers (polymer A to polymer H, and polymer a and polymer b) obtained in Synthesis Examples 1 to 8 and Comparative Synthesis Examples 1 and 2, and an acid, a curing catalyst, an additive, a solvent, and water were mixed in a ratio shown in Table 1 and the mixture was filtered with a filter made of a fluorocarbon resin having a pore size of 0.1 μm. Thus, each solution of the resist underlayer film forming compositions in Example 1 to Example 12 and Comparative Example 1 and Comparative Example 2 was prepared.

The acid, the curing catalyst, the additive, the solvent, and water (refer to Table 1) used in the resist underlayer film forming compositions in Examples and Comparative Examples are as follows. Here, a mass of the polymer does not mean a mass of the solution but means a mass of the polymer itself.

Acid: maleic acid (A)
Curing catalyst: triethylbenzylammonium chloride (A), N-(3-triethoxysilylpropyl)-4,5-dihydroimidazole (B), and mono triphenylsulfonium maleate (C)
Additive: bisphenol S (A), and triphenylsulfonium trifluoromethanesulfonate (B)
Water: ultrapure water (A)
Solvent: propylene glycol monoethyl ether (A), propylene glycol monomethyl ether (B), and propylene glycol monomethyl ether acetate (C)

In the parenthesis in Table 1, the type of the added component and the added amount of the added component are shown in (type of the added component/parts by mass).

TABLE 1

| Example | Polymer | Acid | Curing catalyst | Additive | Water | Solvent |
|---|---|---|---|---|---|---|
| Example 1 | (A/2) | (A/0.02) | (B/0.003) | | (A/7) | (A/82, B/10, C/8) |
| Example 2 | (A/2) | (A/0.02) | (A/0.003) | | (A/7) | (A/82, B/10, C/8) |
| Example 3 | (A/2) | (A/0.02) | (C/0.003) | | (A/7) | (A/82, B/10, C/8) |
| Example 4 | (A/2) | (A/0.02) | (B/0.003) | (A/0.2) | (A/7) | (A/82, B/10, C/8) |
| Example 5 | (A/2) | (A/0.02) | (B/0.003) | (B/0.02) | (A/7) | (A/82, B/10, C/8) |
| Example 6 | (B/2) | (A/0.02) | (B/0.003) | | (A/7) | (A/82, B/10, C/8) |
| Example 7 | (C/2) | (A/0.02) | (B/0.003) | | (A/7) | (A/82, B/10, C/8) |
| Example 8 | (D/2) | (A/0.02) | (B/0.003) | | (A/7) | (A/82, B/10, C/8) |
| Example 9 | (E/2) | (A/0.02) | (B/0.003) | | (A/7) | (A/82, B/10, C/8) |
| Example 10 | (F/2) | (A/0.02) | (B/0.003) | | (A/7) | (A/82, B/10, C/8) |
| Example 11 | (G/2) | (A/0.02) | (B/0.003) | | (A/7) | (A/82, B/10, C/8) |
| Example 12 | (H/2) | (A/0.02) | (B/0.003) | | (A/7) | (A/82, B/10, C/8) |
| Comparative Example 1 | (a/2) | (A/0.02) | (B/0.003) | | (A/7) | (A/82, B/10, C/8) |
| Comparative Example 2 | (b/2) | (A/0.02) | (B/0.003) | | (A/7) | (A/82, B/10, C/8) |

(Solvent Resistance Test)

Each of the resist underlayer film forming compositions in Example 1 to Example 12 and Comparative Example 1 to Comparative Example 2 was applied onto a silicon wafer by using a spin coating method, and the applied composition was baked on a hot plate at 240° C. for 1 minute to form the resist underlayer film. Thereafter, the resist underlayer film was immersed for 1 minute in propylene glycol monomethyl ether acetate (PGMEA), which is used as a solution of an overcoat resist composition. When change between film thicknesses of the resist underlayer film before and after the immersion is 1 nm or less, the result was determined to be "good (○)", whereas the change between the film thicknesses is more than 1 nm, the result was determined to be "poor (X)". The obtained results are shown in Table 2.

(Measurement of Optical Constants)

Each of the resist underlayer film forming compositions in Example 1 to Example 12 and Comparative Example 1 to Comparative Example 2 was applied onto a silicon wafer by using a spinner. The applied composition was heated on a hot plate at 240° C. for 1 minute to form a resist underlayer film (a film thickness of 0.05 μm). A refractive index (n value) and an optical absorption coefficient (k value, also called an attenuation coefficient) of the resist underlayer film were measured by using the spectroscopic ellipsometer (manufactured by J. A. Woollam Co., Inc., VUV-VASE VU-302) at a wavelength of 193 nm. The obtained results are shown in Table 2.

(Measurement of Dry Etching Rate)

Each solution of the resist underlayer film forming compositions in Example 1 to Example 12 and Comparative Example 1 to Comparative Example 2 was applied onto a silicon wafer by using a spinner. The applied composition was heated on a hot plate at 240° C. for 1 minute to form a resist underlayer film (a film having a thickness of 0.08 μm (for measuring an etching rate using the fluorine-based gas ($CF_4$)) and a film having a thickness of 0.05 μm (for measuring an etching rate using $O_2$ gas).

As a reference sample for evaluation of oxygen-based gas resistance, a coating film (a film thickness of 0.05 μm) of an organic underlayer film forming composition (refer to the following) was formed on a silicon wafer by using a spinner in a similar procedure.

The under layer film and the coating film were dry-etched and an etching rate (etching speed: nm/minute) with the fluorine-based gas was measured. For the oxygen-based gas ($O_2$ gas) resistance, an etching rate ratio to the reference sample, that is, [Etching rate of each resist underlayer film in Examples 1 to 12 and Comparative Example 1]/[Etching rate of organic underlayer film] was calculated. The obtained results are shown in Table 2.

The etcher and the etching gas used for the measurement of the dry etching rate are shown below.

ES401 (manufactured by NIPPON SCIENTIFIC Co., Ltd.): $CF_4$

RIE-10NR (manufactured by SAMCO INC.): $O_2$ (Preparation of Organic Underlayer Film Forming Composition)

Into a 200 mL flask, 16.5 g of acenaphthylene, 1.5 g of 4-hydroxystyrene, and 60 g of 1,2-dichloroethane as a solvent were added. Into the mixture, 1 g of boron trifluoride as a polymerization initiator was added and the resultant solution was heated to 60° C., and thereafter, was reacted for 24 hours. Into this solution, 1 L of methanol and 500 g of water were added and reprecipitation purification was performed. The obtained white solid was filtered, and thereafter, dried to obtain 11 g of a white polymer. When the obtained polymer (corresponding to a polymer containing the unit structure of Formula (D-1) below) was measured by $^{13}$C-NMR, $^1$H-NMR, and GPC, a ratio of acenaphthylene/4-hydroxystyrene was 86:14 (molar ratio), Mw was 6,000, and Mw/Mn was 1.5.

The obtained polymer was dissolved in propylene glycol monomethyl ether acetate/cyclohexanone/γ-butyrolactone=15/80/5 (mass ratio), and the obtained solution was used as the organic underlayer film forming composition.

TABLE 2

Formula (D-1)

|  | Refractive index (n value) | Optical absorption coefficient (k value) | Solvent resistance | Etching rate with fluorine-based gas | Oxygen-based gas resistance |
|---|---|---|---|---|---|
| Example 1 | 1.69 | 0.24 | ○ | 22 | 0.03 |
| Example 2 | 1.68 | 0.24 | ○ | 22 | 0.03 |
| Example 3 | 1.68 | 0.25 | ○ | 22 | 0.03 |
| Example 4 | 1.67 | 0.25 | ○ | 22 | 0.03 |
| Example 5 | 1.64 | 0.29 | ○ | 20 | 0.03 |
| Example 6 | 1.76 | 0.37 | ○ | 20 | 0.04 |
| Example 7 | 1.53 | 0.24 | ○ | 23 | 0.03 |
| Example 8 | 1.65 | 0.27 | ○ | 22 | 0.03 |
| Example 9 | 1.68 | 0.24 | ○ | 20 | 0.03 |
| Example 10 | 1.67 | 0.30 | ○ | 22 | 0.03 |
| Example 11 | 1.75 | 0.30 | ○ | 25 | 0.03 |
| Example 12 | 1.68 | 0.24 | ○ | 25 | 0.03 |
| Comparative Example 1 | 1.63 | 0.12 | ○ | 20 | 0.03 |
| Comparative Example 2 | 1.67 | 0.24 | ○ | 25 | 0.05 |

As shown in Table 2, the resist underlayer films formed from the compositions in Examples 1 to 12 and Comparative Examples 1 and 2 had excellent solvent resistance. The refractive indices (n values) were in the range of 1.63 to 1.76 and the optical absorption coefficients (k values) were in the range of 0.12 to 0.37. In other words, it was shown that these resist underlayer films having a thickness of 0.05 μm had the optimum refractive indices (n values) and optical absorption coefficients (k values) that were sufficient for the resist under layer films to exert a sufficient anti-reflection effect.

With regard to the dry etching rates of the resist underlayer films formed from the compositions in Example 1 to Example 12, the maximum fluorine-based gas etching rate was 25 nm/minute (Example 11) and the maximum resistance to the oxygen-based gas was 0.04 (Example 6). Both showed high values, and as a result, the resist underlayer films formed from the compositions in Example 1 to Example 12 showed etching rates and resistance equal to or higher than those of the resist underlayer films formed from the compositions in Comparative Examples 1 and 2.

(Evaluation of Resist Patterning 1)

The above organic underlayer film forming composition (polymer containing composition containing the unit structure of Formula (D-1)) was applied onto a silicon wafer and the applied composition was heated on a hot plate at 215° C. for 1 minute to form an organic underlayer film (A layer) having a film thickness of 200 nm.

Each resist underlayer film forming composition of Example 1 to Example 12 and Comparative Examples 1 and 2 was applied onto the organic underlayer film, and the applied composition was heated on the hot plate at 240° C. for 1 minute to form a resist underlayer film (B layer) having a film thickness of 35 nm. A commercially available photoresist solution (manufactured by FUJIFILM Corporation, trade name FAiRS-9521NT05) was applied by using a spinner onto each of the resist underlayer films, and the applied photoresist solution was heated on the hot plate at 100° C. for 1 minute to form a photoresist film (C layer) having a film thickness of 85 nm.

Subsequently, by using the scanner NSR-S307E manufactured by NIKON CORPORATION (wavelength 193 nm, NA, σ: 0.85, 0.93/0.85), light exposure was carried out through a mask that was set to form a dense line having a line width and a width between lines of the photoresist after development of 0.065 μm, that is, the dense line having lines and spaces (L/S)=1/1 of 0.065 μm, and a mask that was set to form a dense line having a line width and a width between lines of the photoresist after development of 0.060 μM, that is, the dense line having lines and spaces ((L/S)=1/1 of 0.060 μm. Thereafter, the obtained sample was baked on the hot plate at 100° C. for 60 seconds, and, after cooling, was developed using butyl acetate (solvent developer) for 60 seconds to form a negative type pattern on the resist underlayer film (B layer).

For the obtained photoresist pattern, a pattern in which large pattern delamination and undercut were not generated was determined to be good and a pattern in which large pattern delamination and undercut were generated was determined to be poor. The obtained results are shown in Table 3.

TABLE 3

| | Pattern width and space 0.065 μm | Pattern width and space 0.060 μm |
|---|---|---|
| Example 1 | Good | Good (partial peeling) |
| Example 2 | Good | Good (partial peeling) |
| Example 3 | Good | Good (partial peeling) |
| Example 4 | Good | Good |
| Example 5 | Good | Good (partial peeling) |
| Example 6 | Good | Good |
| Example 7 | Good | Good (partial peeling) |
| Example 8 | Good | Good |
| Example 9 | Good | Good |
| Example 10 | Good | Good |

TABLE 3-continued

| | Pattern width and space 0.065 μm | Pattern width and space 0.060 μm |
|---|---|---|
| Example 11 | Good | Good |
| Example 12 | Good | Good |
| Comparative Example 1 | Good (partial peeling) | Poor (large peeling) |
| Comparative Example 2 | Poor (large peeling) | Poor (large peeling) |

As shown in Table 3, the resist film formed on the underlayer film formed by using the composition of the present invention makes it possible to obtain excellent resist shape with the solvent development.

INDUSTRIAL APPLICABILITY

In the lithography carried out using a multilayer film that includes an organic underlayer film on a substrate, a silicon-based resist underlayer film of the present specification on the organic underlayer film, and a solvent development type resist on the silicon-based resist underlayer film, the resist is subjected to solvent development to form a resist pattern, and thereafter, the resist underlayer film and the organic underlayer film are dry-etched. When the treatment is carried out with a solvent developer (organic solvent), an excellent pattern shape is obtained. The present invention provides a useful composition for forming the resist underlayer film in such a process.

The invention claimed is:

1. A method for manufacturing a semiconductor device, the method comprising:

applying onto a substrate a resist underlayer film forming composition that includes hydrolysis-condensation products of hydrolyzable silanes, the hydrolyzable silanes being a silane of Formula (1), a silane of Formula (2), and a silane of Formula (3) and including the silane of Formula (1), the silane of Formula (2), and the silane of Formula (3) in total silanes in a ratio in % by mole of 45 to 90:6 to 20:4 to 35, wherein the hydrolysis-condensation products are obtained by hydrolyzing the hydrolyzable silanes in a ketone solvent, and baking the applied resist underlayer film forming composition to form a resist underlayer film, wherein said resist underlayer film forming composition optionally includes a silane of Formula (1), a silane of Formula (2), and a silane of Formula (3) (Step (A));

applying a composition for a resist onto the underlayer film to form a resist film (Step (B));

exposing a portion of the resist film to light (Step (C));

developing the resist film after the exposing, with an organic solvent as a solvent developer and removing the unexposed part of the resist with the organic solvent to obtain a patterned resist film (Step (D)); and etching the resist underlayer film by using the patterned resist film and processing the substrate using the patterned resist underlayer film (Step (E)), $$Si(R^1)_4 \qquad \text{Formula (1)}$$

$$R^2[Si(R^3)_3] \qquad \text{Formula (2)}$$

$$R^4[Si(R^5)_3]_b \qquad \text{Formula (3)}$$

where $R^1$, $R^3$, and $R^5$ are each an alkoxy group, an acyloxy group, or a halogen atom; $R^2$ is an organic group that includes a benzene ring optionally having a substituent and that bonds to a silicon atom through a Si—C bond; $R^4$ is an organic group that includes a hydrocarbon optionally having a substituent and that bonds to a silicon atom through a Si—C bond; a is an integer of 1 to 3; and b is an integer of 1 to 3, and wherein, in the step (A) the resist underlayer film forming composition includes a curing catalyst, and the curing catalyst acts as a curing catalyst when baking the applied resist underlayer film forming composition to form and cure the resist underlayer film, and is selected from the group consisting of ammonium salts, phosphines, phosphonium salts, and sulfonium salts, and is contained in an amount of 0.01 part by mass to 10 parts by mass per 100 parts by mass of the polyorganosiloxane.

2. The method for manufacturing a semiconductor device according to claim 1, wherein Step (A) is Step (A') of forming an organic underlayer film on the substrate, applying the resist underlayer film forming composition onto the organic underlayer film, and baking the applied resist underlayer film forming composition to form the resist underlayer film, and Step (E) is Step (E') of etching the resist underlayer film by using the patterned resist film, etching the organic underlayer film by using the patterned resist underlayer film, and processing the substrate by using the patterned organic underlayer film.

3. The method for manufacturing a semiconductor device according to claim 1, wherein $R^2$ in Formula (2) is a phenyl group optionally having a substituent, and a is an integer of 1.

4. The method for manufacturing a semiconductor device according to claim 1, wherein $R^4$ in Formula (3) is a methyl group optionally having a substituent, and a is an integer of 1.

5. The method for manufacturing a semiconductor device according to claim 1, wherein $R^4$ in Formula (3) is an alkylene isocyanurate group optionally having a substituent, and a is an integer of 1.

6. The method for manufacturing a semiconductor device according to claim 1, wherein $R^2$ in Formula (2) is an organic group that includes a benzene ring optionally having an alkoxy group, an organic group having a protected alcohol as a substituent, and $R^4$ in Formula (3) is an organic group that includes a hydrocarbon optionally having an alkoxy group, an organic group having a protected alcoholic hydroxyl group, or an allyl group as a substituent.

7. The method for manufacturing a semiconductor device according to claim 1, wherein the organic solvent for developing the resist film is selected from the group consisting of methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxy-butyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxy-pentyl acetate, 4-methyl-4-methoxy-pentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl 3-methoxypropionate, ethyl 3-methoxypropionate, ethyl 3-ethoxypropionate, propyl 3-methoxypropionate, and 2-heptanone.

8. The method for manufacturing a semiconductor device according to claim 1, wherein the resist underlayer film forming composition further includes a silane of Formula (1), a silane of Formula (2), and a silane of Formula (3), hydrolysis products of the silanes, or a combination thereof.

9. The method for manufacturing a semiconductor device according to claim 1, wherein the ketone solvent is acetone.

10. The method for manufacturing a semiconductor device according to claim 1, wherein said exposing is carried out through a mask.

11. The method for manufacturing a semiconductor device according to claim 1, wherein said resist underlayer film forming composition contains no hydrolyzable silane or hydrolysis-condensation product of a hydrolyzable silane, other than a silane of Formula (1), a silane of Formula (2), and a silane of Formula (3).

* * * * *